(12) United States Patent
Larsen et al.

(10) Patent No.: US 9,303,440 B2
(45) Date of Patent: Apr. 5, 2016

(54) DOOR ASSEMBLY

(71) Applicant: Ortronics, Inc., New London, CT (US)

(72) Inventors: Lars R. Larsen, Old Lyme, CT (US);
Chris M. Vacca, Westerly, RI (US);
James P. Quinn, Jr., Clinton, CT (US)

(73) Assignee: Ortronics, Inc., New London, CT (US)

( * ) Notice: Subject to any disclaimer, the term of this patent is extended or adjusted under 35 U.S.C. 154(b) by 0 days.

(21) Appl. No.: 14/304,131

(22) Filed: Jun. 13, 2014

(65) Prior Publication Data

US 2015/0361704 A1 Dec. 17, 2015

(51) Int. Cl.
| | |
|---|---|
| *E05D 15/50* | (2006.01) |
| *E05F 1/10* | (2006.01) |
| *E05B 9/00* | (2006.01) |
| *E05B 15/00* | (2006.01) |
| *A47B 96/00* | (2006.01) |
| *E05B 5/00* | (2006.01) |

(52) U.S. Cl.
CPC .................. *E05F 1/105* (2013.01); *A47B 96/00* (2013.01); *E05B 5/006* (2013.01); *E05B 9/00* (2013.01); *E05B 9/002* (2013.01); *E05B 15/00* (2013.01); *E05F 1/10* (2013.01)

(58) Field of Classification Search
CPC ............ E05F 1/105; E05F 1/10; E05B 5/006; E05B 9/002; E05B 15/00; E05B 9/00; A47B 96/00
USPC ........................................... 49/192, 193, 382
See application file for complete search history.

(56) References Cited

U.S. PATENT DOCUMENTS

| | | | |
|---|---|---|---|
| 331,466 | A | 12/1885 | Whitney |
| 1,550,205 | A | 8/1925 | Cemazar |
| 1,560,537 | A | 11/1925 | Cole |
| 2,195,679 | A | 4/1940 | Rapp |
| 2,195,991 | A | 4/1940 | Lovett |
| 2,817,870 | A | 12/1957 | Howell |
| 3,048,898 | A | 8/1962 | Davis |
| 3,403,473 | A | 10/1968 | Navarro |
| 3,976,024 | A | 8/1976 | Fillery |
| 4,103,956 | A | 8/1978 | Faulstich |

(Continued)

FOREIGN PATENT DOCUMENTS

| | | |
|---|---|---|
| EP | 0504044 | 9/1992 |
| JP | 3161680 | 11/1991 |
| JP | 0658039 | 1/1994 |

OTHER PUBLICATIONS

PCT International Search Report from PCT/US2004/30625 dated Mar. 10, 2006.

*Primary Examiner* — Jerry Redman
(74) *Attorney, Agent, or Firm* — McCarter & English, LLP

(57) ABSTRACT

Improved door assemblies and related methods of use are provided. More particularly, the present disclosure provides advantageous systems/methods for the design and use of door assemblies configured to mount with respect to a mounting structure associated with a rack or the like. The present disclosure provides for mechanisms for mounting, opening, closing and releasing a door assembly relative to a mounting structure. The present disclosure provides for a rack-mounted door assembly having alternative pivoting axes. Exemplary door assemblies of the present disclosure are configured so as to be simultaneously hinged at the left and at the right, and to permit easy opening from either the right or left, as well as to allow for the complete removal of the door from its mounting structure.

16 Claims, 23 Drawing Sheets

(56) References Cited

U.S. PATENT DOCUMENTS

| | | | |
|---|---|---|---|
| 4,495,673 A * | 1/1985 | Khan | 16/232 |
| 4,503,582 A * | 3/1985 | Gurubatham | 16/232 |
| 4,503,583 A * | 3/1985 | Frohbieter | 16/232 |
| 4,612,728 A | 9/1986 | Moriyoshi | |
| 4,811,518 A | 3/1989 | Ladisa | |
| 4,947,583 A * | 8/1990 | Inui et al. | 49/193 |
| 5,064,255 A * | 11/1991 | Inui et al. | 312/405 |
| 5,187,836 A * | 2/1993 | Kim et al. | 16/231 |
| 5,357,652 A | 10/1994 | Yamada | |
| 5,367,828 A | 11/1994 | Hashemnia | |
| 5,407,263 A | 4/1995 | Jones et al. | |
| 5,548,927 A | 8/1996 | Song | |
| 5,560,148 A | 10/1996 | Chang | |
| 5,647,652 A | 7/1997 | Zalewski et al. | |
| 5,675,934 A | 10/1997 | Park | |
| 5,697,121 A | 12/1997 | Early | |
| 5,761,849 A | 6/1998 | Tokuno | |
| 5,829,197 A * | 11/1998 | Oh | 49/193 |
| 5,926,916 A | 7/1999 | Lee et al. | |
| 6,000,771 A | 12/1999 | Wissinger et al. | |
| 6,003,716 A | 12/1999 | Allison et al. | |
| 6,065,612 A | 5/2000 | Rinderer | |
| 6,250,729 B1 | 6/2001 | Allison et al. | |
| 6,489,565 B1 | 12/2002 | Krietzman et al. | |
| 6,708,368 B2 | 3/2004 | Nhep et al. | |
| 6,814,244 B1 | 11/2004 | Hathcock | |
| 6,835,891 B1 | 12/2004 | Herzog et al. | |
| 6,946,605 B2 | 9/2005 | Levesque et al. | |
| 6,968,647 B2 | 11/2005 | Levesque et al. | |
| 7,026,553 B2 | 4/2006 | Levesque et al. | |
| 7,225,586 B2 | 6/2007 | Levesque et al. | |
| 7,913,355 B2 * | 3/2011 | Choi | 16/230 |
| 8,966,821 B2 * | 3/2015 | Walker et al. | 49/382 |
| 2003/0020379 A1 | 1/2003 | Larsen et al. | |
| 2005/0115152 A1 * | 6/2005 | Levesque et al. | 49/192 |
| 2009/0129014 A1 | 5/2009 | Larsen et al. | |
| 2013/0111817 A1 * | 5/2013 | Koberling | 49/382 |

* cited by examiner

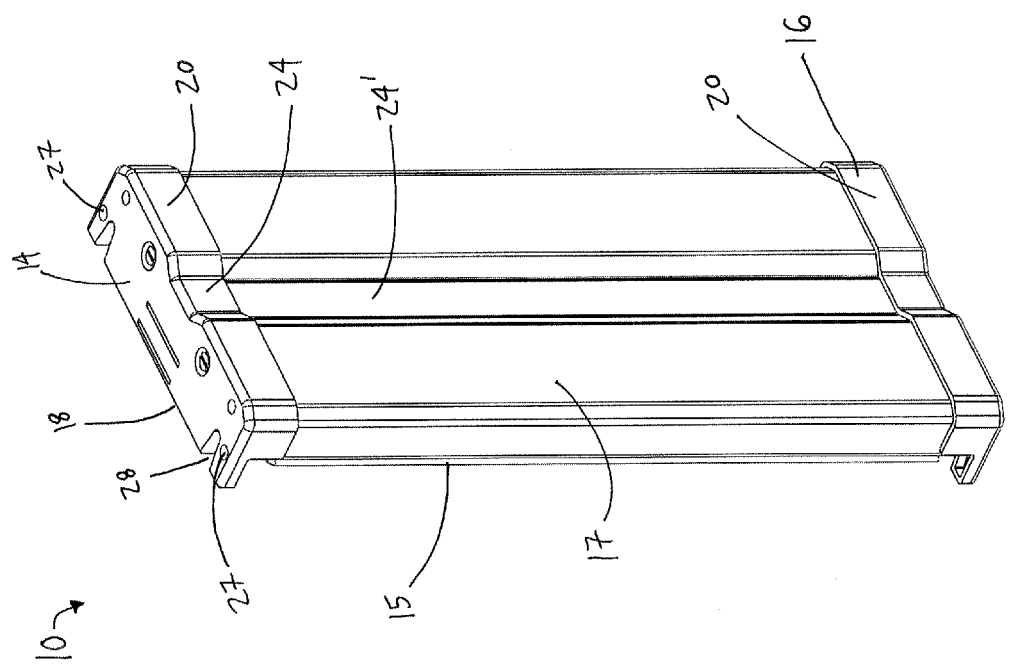
FIG. 1

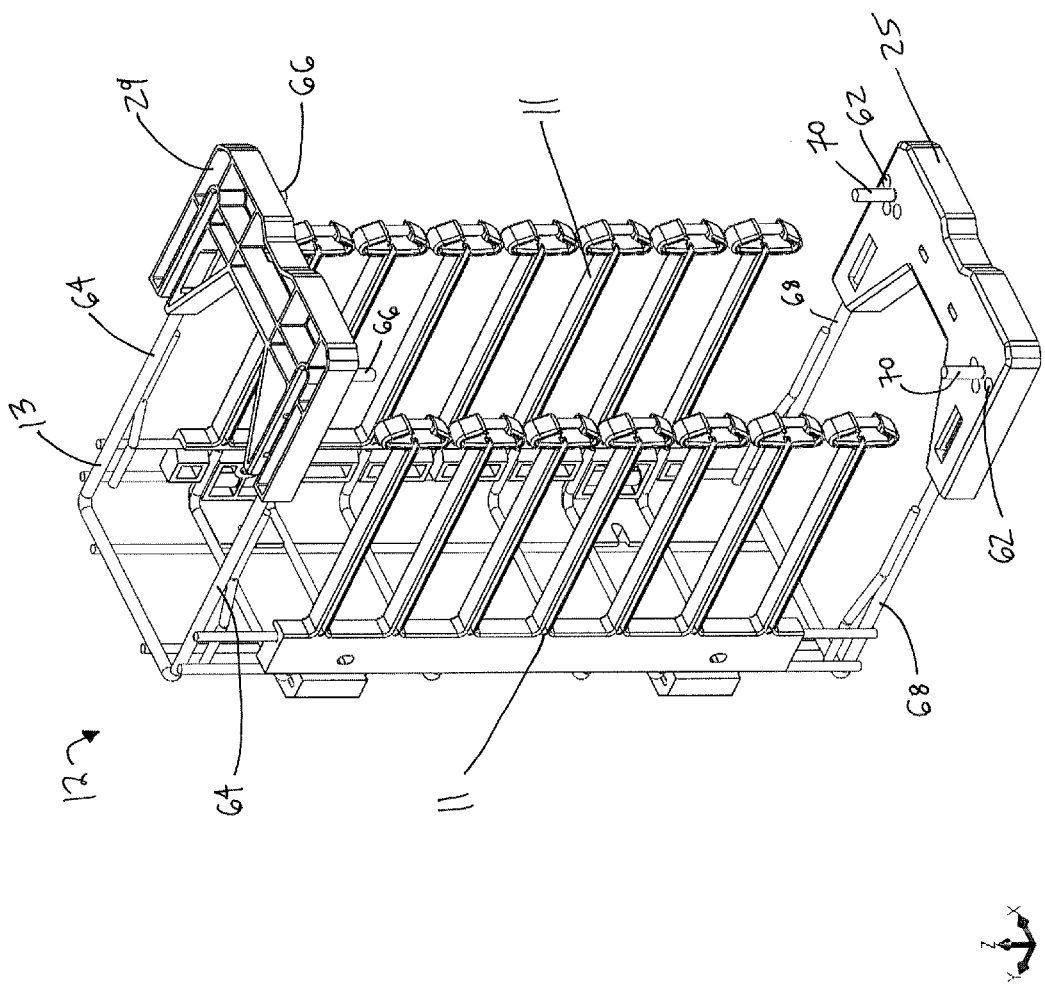

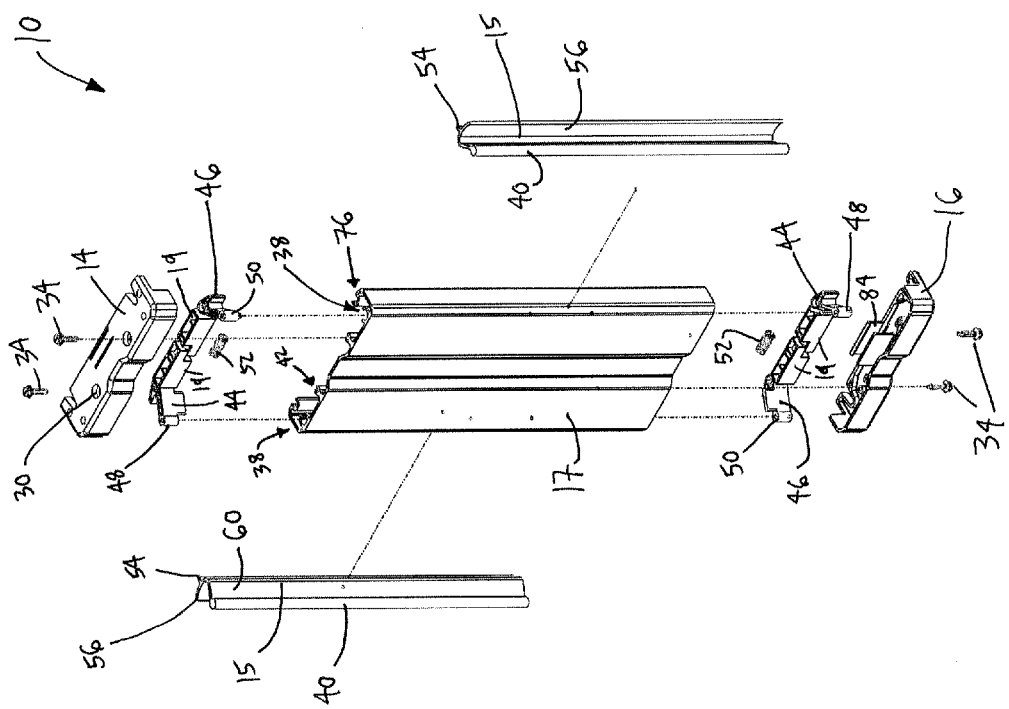

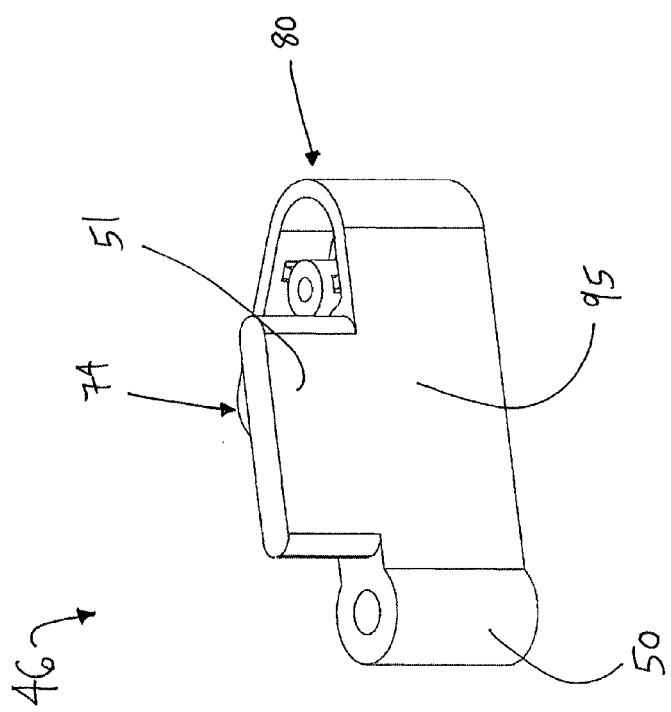
FIG. 8

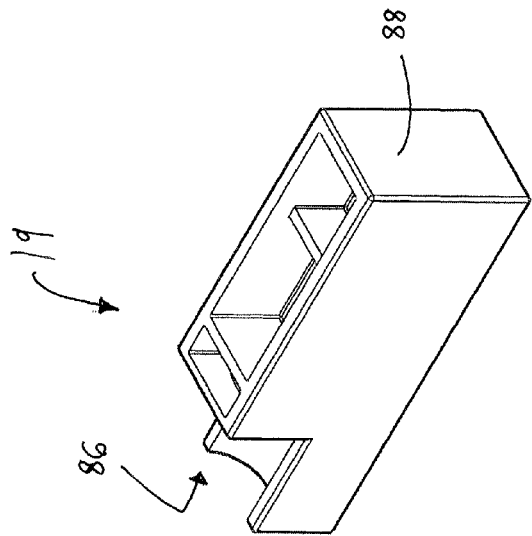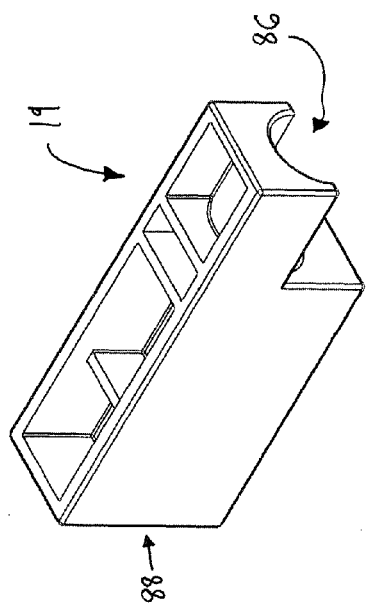
FIG. 9

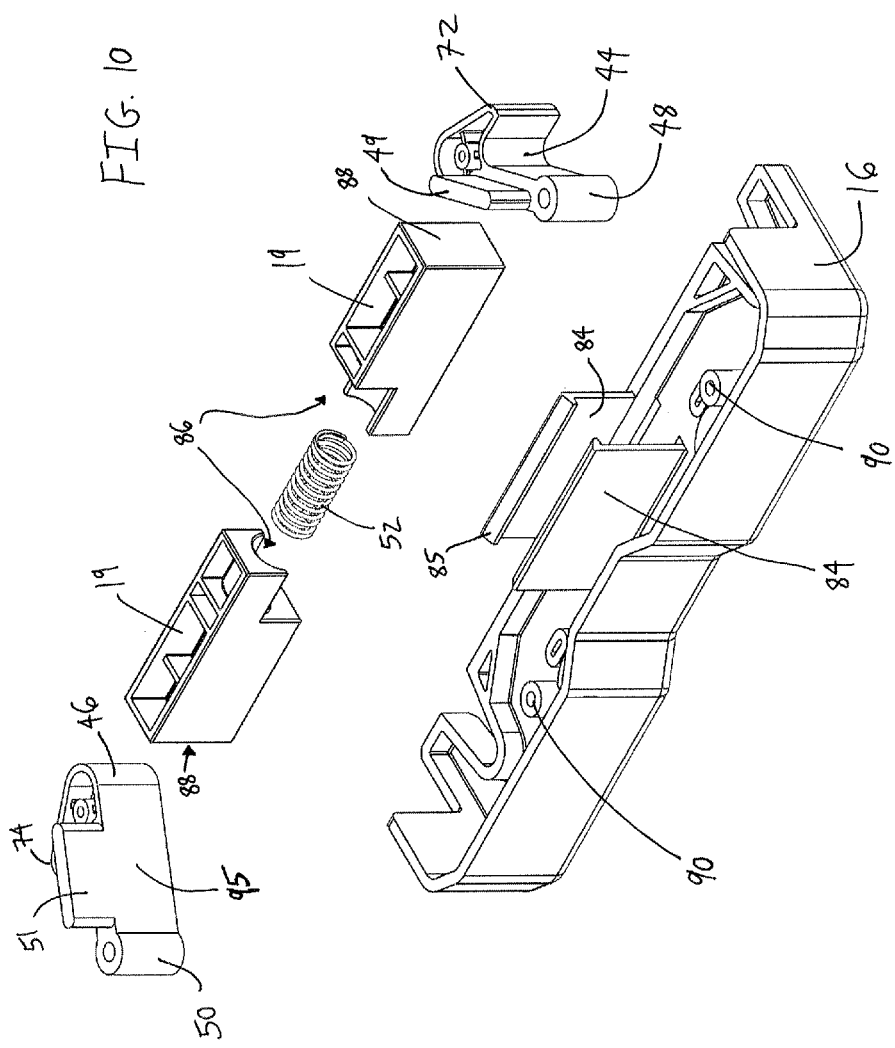

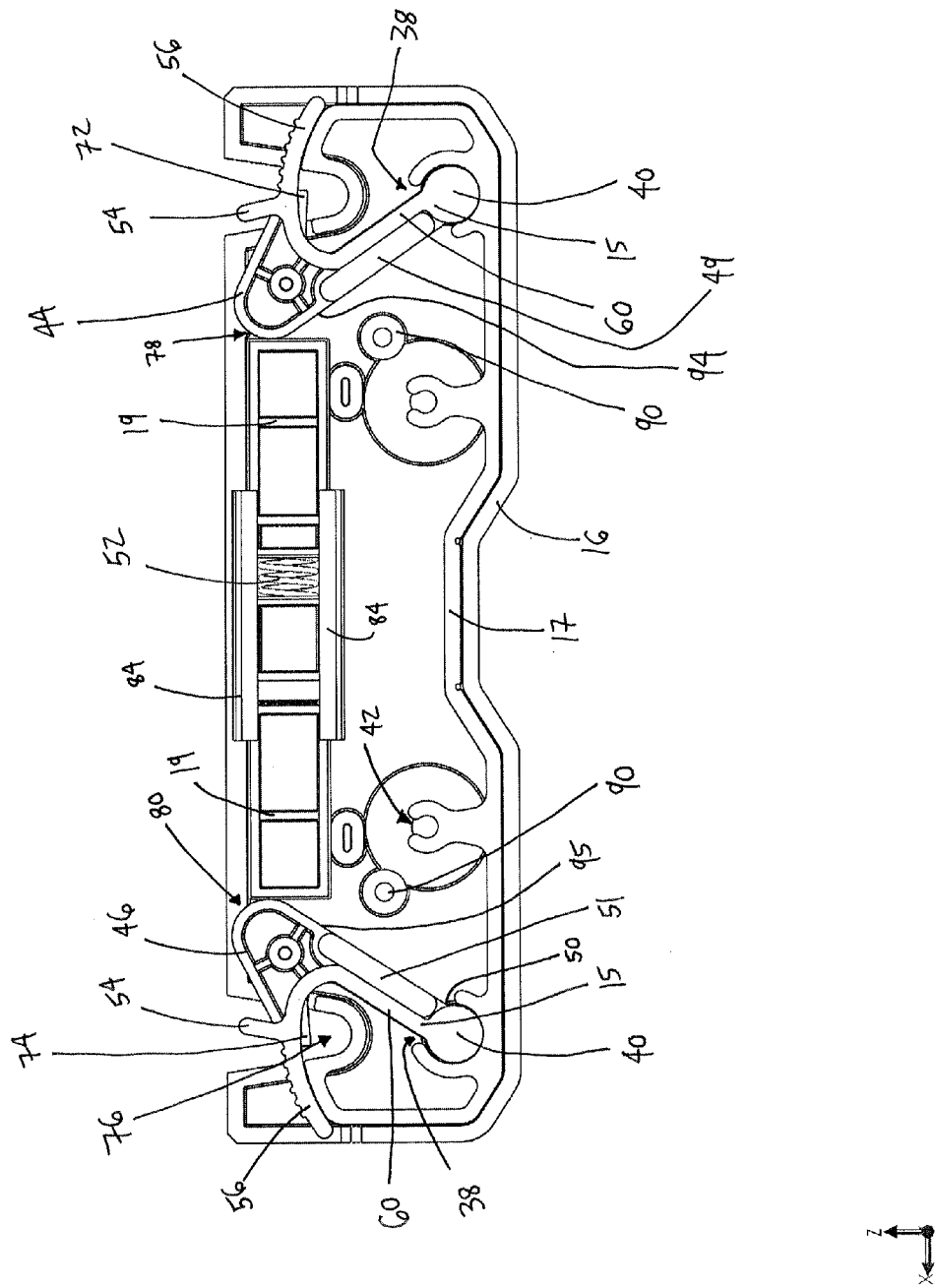

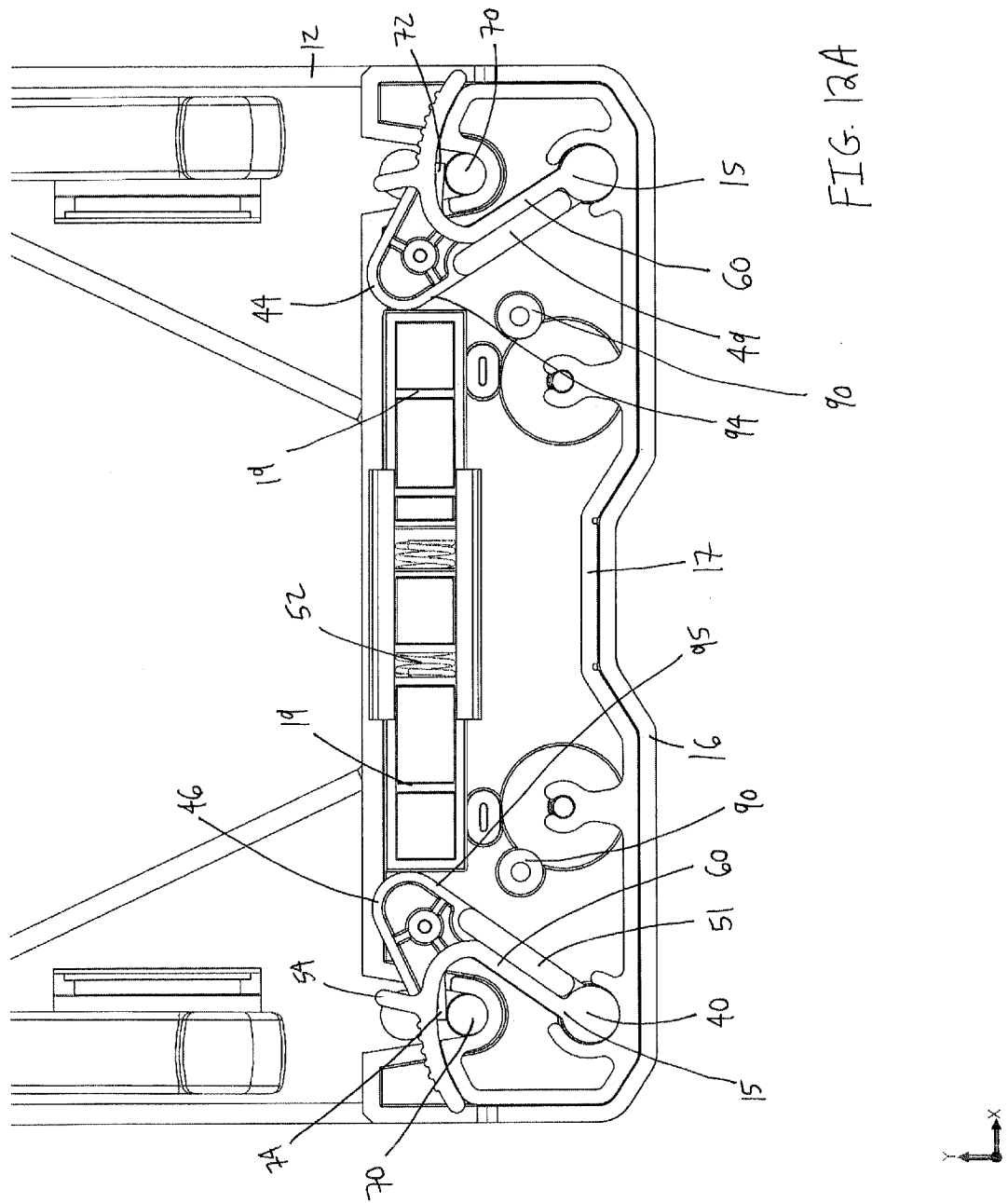

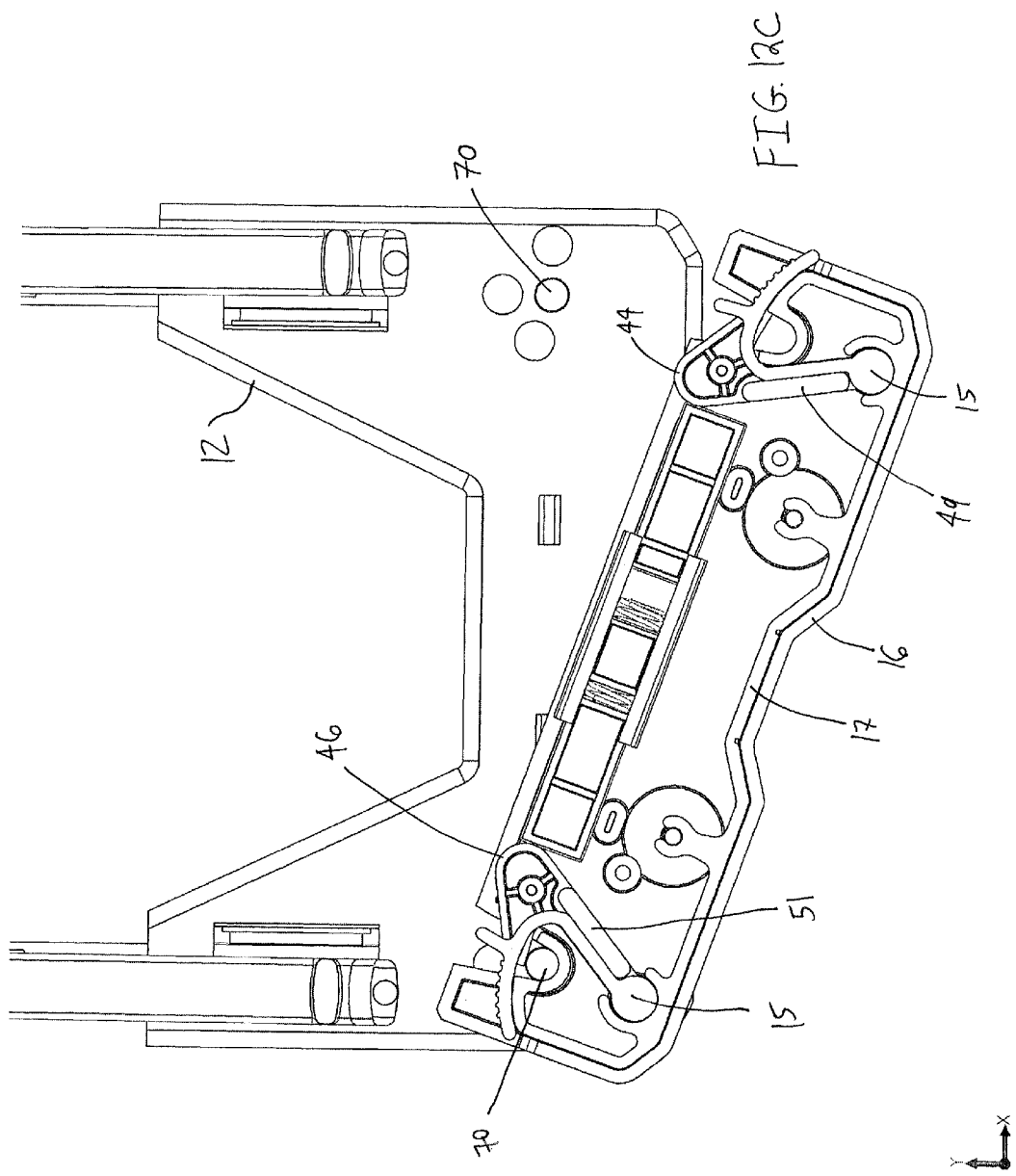

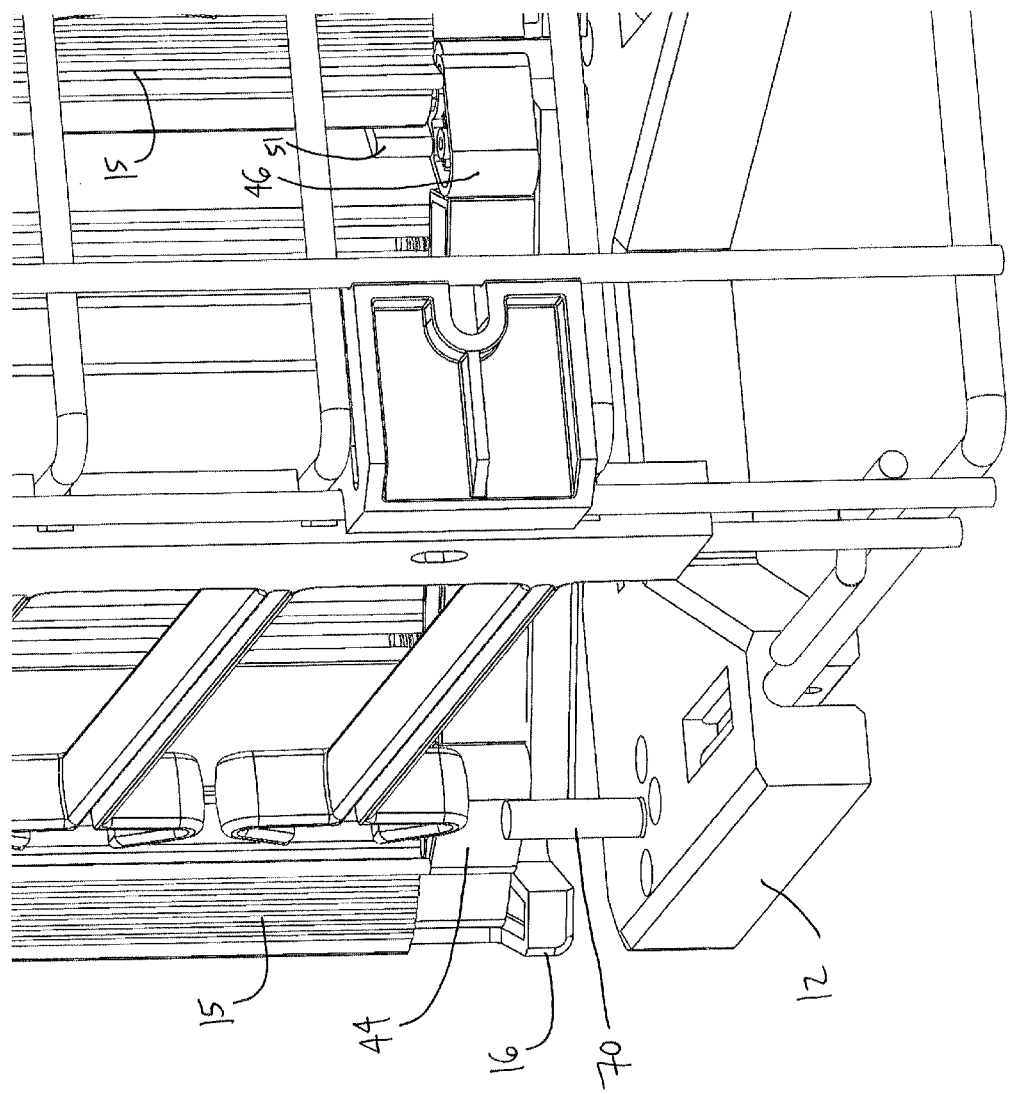
FIG. 13A

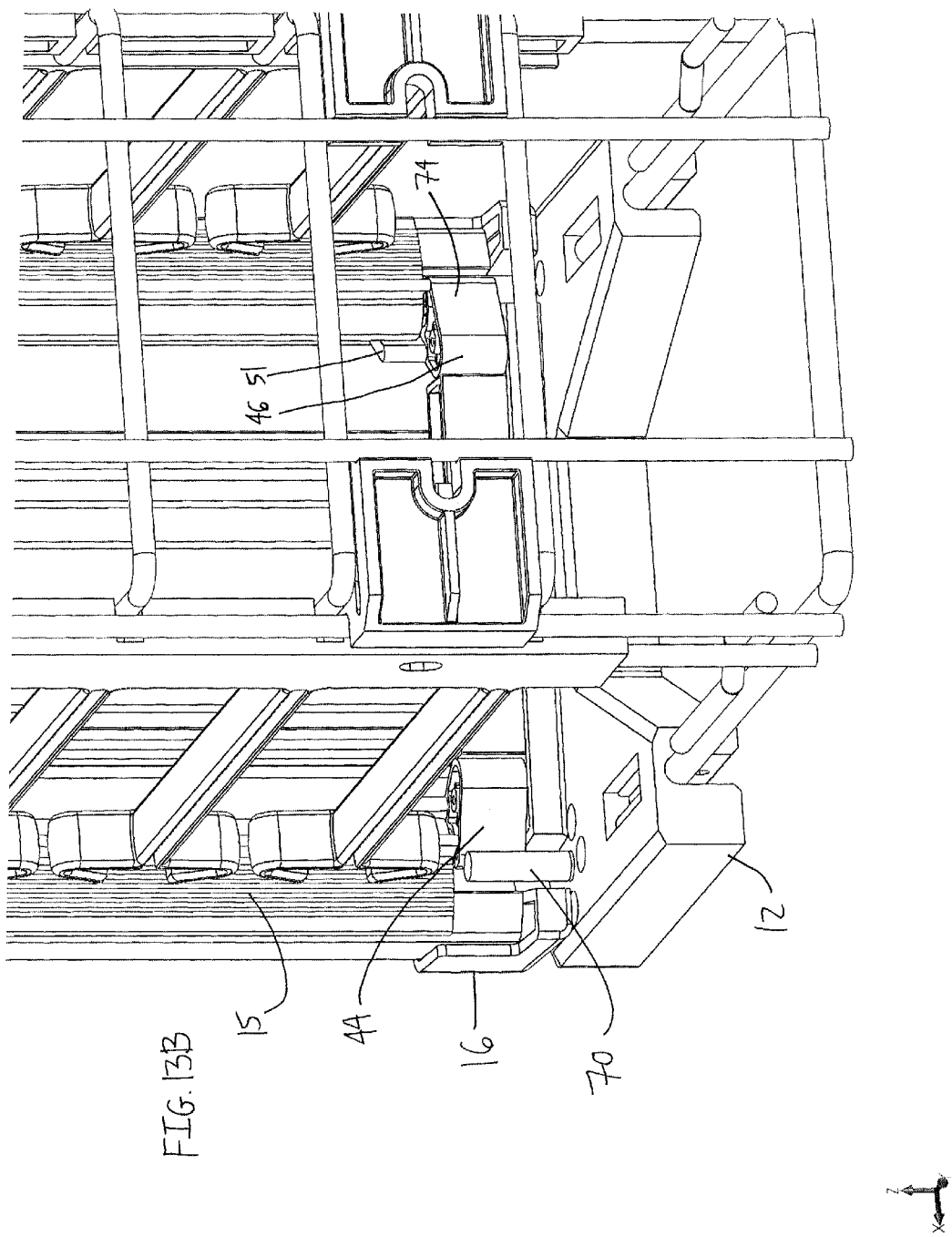

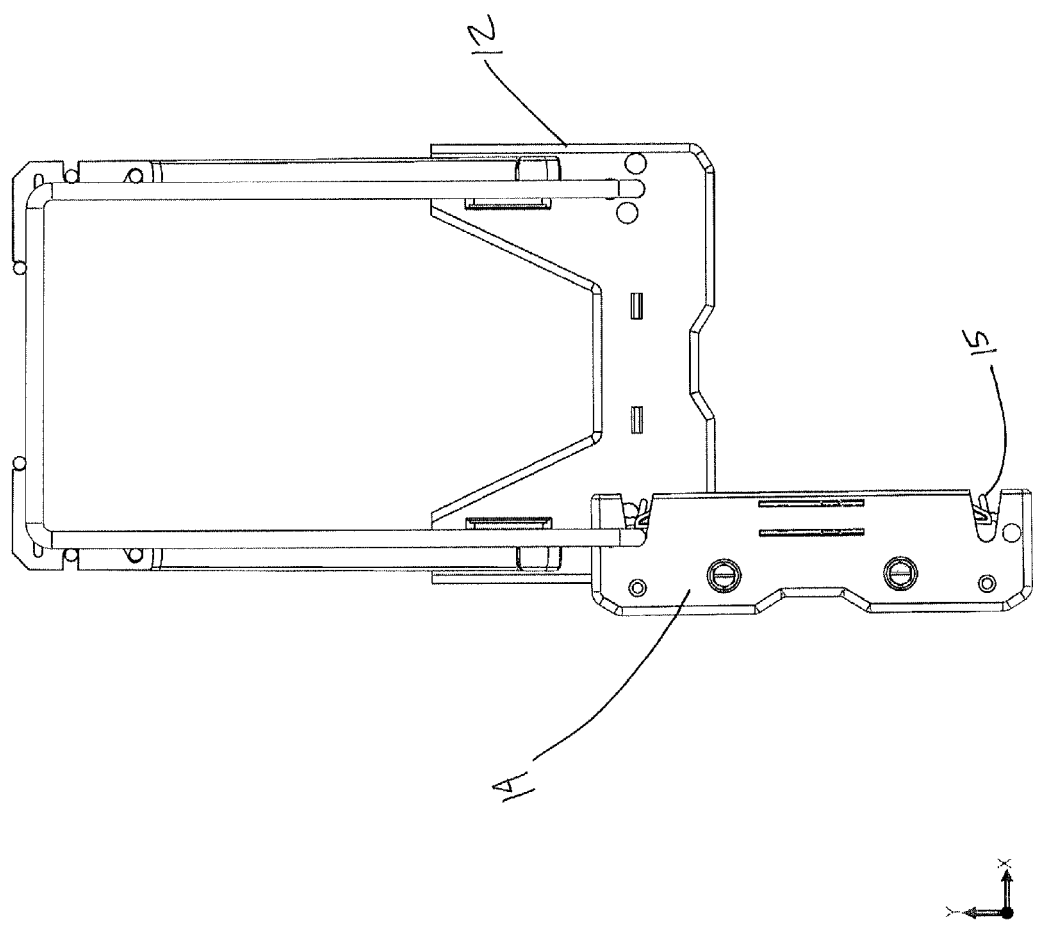

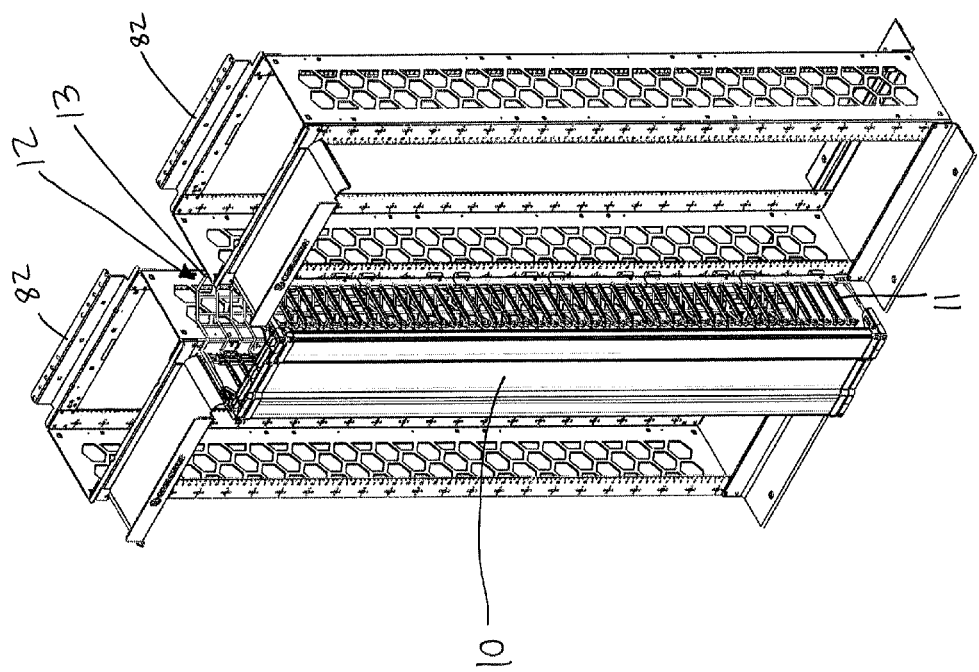
FIG. 15

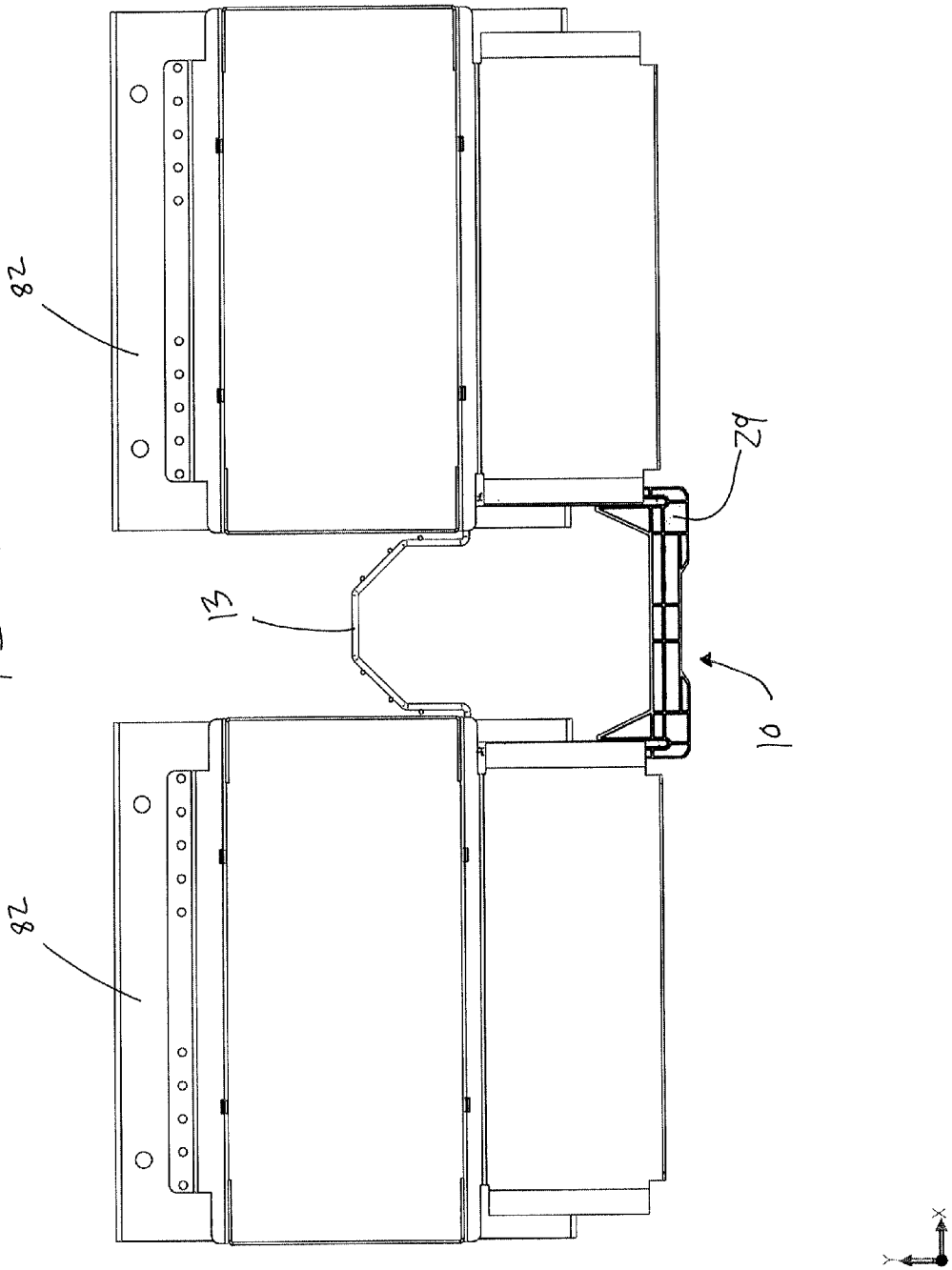

DOOR ASSEMBLY

BACKGROUND

1. Technical Field

The present disclosure relates to door assemblies and, more particularly to the design and use of door assemblies configured to mount with respect to a mounting structure associated with a rack or the like.

2. Background Art

In general, some data transfer media cabinets include a frame structure that defines a plurality of shelves upon which equipment (e.g., electronic equipment) may be positioned and/or stored. Such cabinets can include openings at various locations (e.g., top and/or side locations) to facilitate wiring, heat dissipation, and/or ready access to power sources.

Moreover, such cabinets generally include a door that permits the contents of the cabinet to be shielded from view and/or protected from damage. The door is typically mounted to the frame by a hinge that is located on one side of the door, and a latch is typically provided on the other side of the door so that the door may be opened, for example, from left to right.

Some exemplary assemblies/systems in this general field are described and disclosed in U.S. Pat. Nos. 1,550,205; 1,560,537; 2,195,991; 4,612,728; 5,357,652; 5,367,828; 5,560,148; 5,926,916; 6,946,605; 6,968,647 and 7,225,586, and U.S. Patent Pub. No. 2003/0020379, the entire contents of each being hereby incorporated by reference in their entireties.

A constant need exists among manufacturers to develop door assemblies that include improved features and structures.

Thus, an interest exists for improved door assemblies and related methods of use. These and other inefficiencies and opportunities for improvement are addressed and/or overcome by the assemblies, systems and methods of the present disclosure.

SUMMARY

The present disclosure provides advantageous door assemblies, and improved methods/systems for using the same. More particularly, the present disclosure provides improved systems/methods for the design and use of door assemblies configured to mount with respect to a mounting structure associated with a rack or the like.

In exemplary embodiments, the present disclosure provides for mechanisms for mounting, opening, closing and releasing a door assembly relative to a mounting structure. In general, the present disclosure provides for a rack-mounted door assembly having alternative pivoting axes. Exemplary door assemblies of the present disclosure are structured/configured so as to be simultaneously hinged at the left and at the right, and to permit easy opening from either the right or left, as well as to allow for the complete removal of the door from its mounting structure.

The present disclosure provides for a door assembly including a cover member, the cover member having: (i) first and second handle member retaining grooves, and (ii) first and second pin retaining grooves; a pair of handle members that are rotatably mounted with respect to the first and second handle member retaining grooves, respectively, each handle member retaining groove having at least a portion of a first latch member mounted with respect to a first end of the handle member retaining groove and at least a portion of a second latch member mounted with respect to a second end of the handle member retaining groove; wherein the first and second latch members mounted with respect to the first handle member retaining groove are movable between: (i) a first position where a mounting structure is configured to be received by the first pin retaining groove, and (ii) a second position where the mounting structure is configured to be releasably secured in the first pin retaining groove via a latching portion of the first and second latch members; and wherein the first and second latch members mounted with respect to the second handle member retaining groove are movable between: (i) a first position where the mounting structure is configured to be received by the second pin retaining groove, and (ii) a second position where the mounting structure is configured to be releasably secured in the second pin retaining groove via a latching portion of the first and second latch members.

The present disclosure also provides for a door assembly wherein the handle member of the first handle member retaining groove is configured to be moved by a user to move the first and second latch members of the first handle member retaining groove to the first position; and wherein the handle member of the second handle member retaining groove is configured to be moved by the user to move the first and second latch members of the second handle member retaining groove to the first position.

The present disclosure also provides for a door assembly further including a pair of end cap members that are mountable with respect to a first end and a second end of the cover member, respectively.

The present disclosure also provides for a door assembly wherein each end cap member includes first and second push-rod members mounted with respect to each end cap member, the first and second push-rod members defining a channel that houses a spring member; wherein after the first and second latch members of the first handle member retaining groove have been moved to the first position and the mounting structure is received by the first pin retaining groove, the first push-rod members of the end cap members, via force from the spring members, are configured to move the first and second latch members of the first handle member retaining groove to the second position; and wherein after the first and second latch members of the second handle member retaining groove have been moved to the first position and the mounting structure is received by the second pin retaining groove, the second push-rod members of the end cap members, via force from the spring members, are configured to move the first and second latch members of the second handle member retaining groove to the second position.

The present disclosure also provides for a door assembly wherein the handle member of the first handle member retaining groove is configured to be moved by a user to move the first and second latch members of the first handle member retaining groove to the first position; and wherein the handle member of the second handle member retaining groove is configured to be moved by the user to move the first and second latch members of the second handle member retaining groove to the first position.

The present disclosure also provides for a door assembly wherein after the first and second latch members of the first handle member retaining groove have been moved to the first position and after the user releases the handle member of the first handle member retaining groove, then the first push-rod members of the end cap members, via force from the spring members, are configured to move the first and second latch members of the first handle member retaining groove to the second position; and wherein after the first and second latch members of the second handle member retaining groove have been moved to the first position and after the user releases the handle member of the second handle member retaining groove, then the second push-rod members of the end cap members, via force from the spring members, are configured to move the first and second latch members of the second handle member retaining groove to the second position. The present disclosure also provides for a door assembly wherein the handle member of the first handle member retaining groove includes a first mating wall, the first mating wall configured to be moved by a user to engage and move engagement walls of the first and second latch members of the first handle member retaining groove to thereby move the first and second latch members of the first handle member retaining groove to the first position; and wherein the handle member of the second handle member retaining groove includes a second mating wall, the second mating wall configured to be moved by a user to engage and move engagement walls of the first and second latch members of the second handle member retaining groove to thereby move the first and second latch members of the second handle member retaining groove to the first position.

The present disclosure also provides for a door assembly further including a pair of end cap members that are mountable with respect to a first end and a second end of the cover member, respectively; and wherein each end cap member includes first and second boss members, the first boss members of the end cap members configured to abut against and stop the movement of a respective first or second latch member of the first handle member retaining groove at an end point of the first position for the first and second latch members of the first handle member retaining groove; and wherein the second boss members of the end cap members are configured to abut against and stop the movement of a respective first or second latch member of the second handle member retaining groove at an end point of the first position for the first and second latch members of the second handle member retaining groove.

The present disclosure also provides for a door assembly wherein each end cap member includes a rear wall having first and second slots formed therein; wherein at least a portion of the first pin retaining groove is configured to be positioned within the first slots of the end cap members when the end cap members are mounted with respect to the ends of the cover member; and wherein at least a portion of the second pin retaining groove is configured to be positioned within the second slots of the end cap members when the end cap members are mounted with respect to the ends of the cover member.

The present disclosure also provides for a door assembly wherein the first and second handle member retaining grooves are each configured and dimensioned for receipt of and interaction with an engagement region of a respective handle member. The present disclosure also provides for a door assembly wherein each end cap member includes two retaining walls, the two retaining walls configured to house and retain the first and second push-rod members.

The present disclosure also provides for a door assembly wherein each first and second push-rod member of each end cap member includes an end portion that is proximal to an engagement surface of a respective first or second latch member.

The present disclosure also provides for a door assembly wherein when the handle member of the first handle member retaining groove is moved by the user to move the first and second latch members of the first handle member retaining groove to the first position, the first push-rod members of the end cap members are moved inward by the first and second latch members of the first handle member retaining groove and the spring member contracts; and wherein when the handle member of the second handle member retaining groove is moved by the user to move the first and second latch members of the second handle member retaining groove to the first position, the second push-rod members of the end cap members are moved inward by the first and second latch members of the second handle member retaining groove and the spring member contracts.

The present disclosure also provides for a method for mounting a door assembly including a) providing a mounting structure having first and second pairs of mounting projections; b) providing a cover member having: (i) first and second handle member retaining grooves, and (ii) first and second pin retaining grooves; c) rotatably mounting a pair of handle members with respect to the first and second handle member retaining grooves, respectively, each handle member retaining groove having at least a portion of a first latch member mounted with respect to a first end of the handle member retaining groove and at least a portion of a second latch member mounted with respect to a second end of the handle member retaining groove; d) moving the first and second latch members mounted with respect to the first handle member retaining groove to a first position so that the first pair of mounting projections are received by the first pin retaining groove; e) moving the first and second latch members mounted with respect to the first handle member retaining groove to a second position so that the first pair of mounting projections are releasably secured in the first pin retaining groove via a latching portion of the first and second latch members of the first handle member retaining groove; f) moving the first and second latch members mounted with respect to the second handle member retaining groove to a first position so that the second pair of mounting projections are received by the second pin retaining groove; and g) moving the first and second latch members mounted with respect to the second handle member retaining groove to a second position so that the second pair of mounting projections are releasably secured in the second pin retaining groove via a latching portion of the first and second latch members of the second handle member retaining groove.

The present disclosure also provides for a method for mounting a door assembly further including, after step c) and before step d), the step of mounting a pair of end cap members with respect to a first end and a second end of the cover member.

The present disclosure also provides for a method for mounting a door assembly wherein each end cap member includes first and second push-rod members mounted with respect to each end cap member, the first and second push-rod members defining a channel that houses a spring member; wherein after the first and second latch members of the first handle member retaining groove have been moved to the first position and the first pair of mounting projections are received by the first pin retaining groove, the first push-rod members of the end cap members, via force from the spring members, are configured to move the first and second latch members of the first handle member retaining groove to the second position; and wherein after the first and second latch members of the second handle member retaining groove have been moved to the first position and the second pair of mounting projections are received by the second pin retaining groove, the second push-rod members of the end cap members, via force from the spring members, are configured to move the first and second latch members of the second handle member retaining groove to the second position.

The present disclosure also provides for a method for mounting a door assembly wherein the handle member of the first handle member retaining groove includes a first mating wall, the first mating wall configured to be moved by a user to engage and move engagement walls of the first and second latch members of the first handle member retaining groove to thereby move the first and second latch members of the first handle member retaining groove to the first position; and wherein the handle member of the second handle member retaining groove includes a second mating wall, the second mating wall configured to be moved by a user to engage and move engagement walls of the first and second latch members of the second handle member retaining groove to thereby move the first and second latch members of the second handle member retaining groove to the first position.

The present disclosure also provides for a method for mounting a door assembly wherein each end cap member includes first and second boss members, the first boss members of the end cap members configured to abut against and stop the movement of a respective first or second latch member of the first handle member retaining groove at an end point of the first position for the first and second latch members of the first handle member retaining groove; and wherein the second boss members of the end cap members are configured to abut against and stop the movement of a respective first or second latch member of the second handle member retaining groove at an end point of the first position for the first and second latch members of the second handle member retaining groove.

The present disclosure also provides for a door assembly including a cover member, the cover member having: (i) first and second handle member retaining grooves, and (ii) first and second pin retaining grooves; a pair of end cap members that are mountable with respect to a first end and a second end of the cover member, respectively; a pair of handle members that are rotatably mounted with respect to the first and second handle member retaining grooves, respectively, each handle member retaining groove having at least a portion of a first latch member mounted with respect to a first end of the handle member retaining groove and at least a portion of a second latch member mounted with respect to a second end of the handle member retaining groove; wherein the first and second latch members mounted with respect to the first handle member retaining groove are movable between: (i) a first position where a mounting structure is configured to be received by the first pin retaining groove, and (ii) a second position where the mounting structure is configured to be releasably secured in the first pin retaining groove via a latching portion of the first and second latch members; and wherein the first and second latch members mounted with respect to the second handle member retaining groove are movable between: (i) a first position where the mounting structure is configured to be received by the second pin retaining groove, and (ii) a second position where the mounting structure is configured to be releasably secured in the second pin retaining groove via a latching portion of the first and second latch members; wherein each end cap member includes first and second push-rod members mounted with respect to each end cap member, the first and second push-rod members defining a channel that houses a spring member; wherein after the first and second latch members of the first handle member retaining groove have been moved to the first position and the mounting structure is received by the first pin retaining groove, the first push-rod members of the end cap members, via force from the spring members, are configured to move the first and second latch members of the first handle member retaining groove to the second position; wherein after the first and second latch members of the second handle member retaining groove have been moved to the first position and the mounting structure is received by the second pin retaining groove, the second push-rod members of the end cap members, via force from the spring members, are configured to move the first and second latch members of the second handle member retaining groove to the second position; and wherein the first and second handle member retaining grooves are each configured and dimensioned for receipt of and interaction with an engagement region of a respective handle member.

The present disclosure also provides for a door assembly wherein the handle member of the first handle member retaining groove includes a first mating wall, the first mating wall configured to be moved by a user to engage and move engagement walls of the first and second latch members of the first handle member retaining groove to thereby move the first and second latch members of the first handle member retaining groove to the first position; and wherein the handle member of the second handle member retaining groove includes a second mating wall, the second mating wall configured to be moved by a user to engage and move engagement walls of the first and second latch members of the second handle member retaining groove to thereby move the first and second latch members of the second handle member retaining groove to the first position.

The present disclosure also provides for a door assembly wherein when the first and second latch members of the first handle member retaining groove are moved to the first position by the user via the handle member of the first handle member retaining groove, the first and second push-rod members and the spring member prevent the user from simultaneously moving the first and second latch members of the second handle member retaining groove to the first position via the handle member of the second handle member retaining groove; and wherein when the first and second latch members of the second handle member retaining groove are moved to the first position by the user via the handle member of the second handle member retaining groove, the first and second push-rod members and the spring member prevent the user from simultaneously moving the first and second latch members of the first handle member retaining groove to the first position via the handle member of the first handle member retaining groove.

Any combination or permutation of embodiments is envisioned. Additional advantageous features, functions and applications of the disclosed systems, methods and assemblies of the present disclosure will be apparent from the description which follows, particularly when read in conjunction with the appended figures. All references listed in this disclosure are hereby incorporated by reference in their entireties.

BRIEF DESCRIPTION OF THE DRAWINGS

Features and aspects of embodiments are described below with reference to the accompanying drawings, in which elements are not necessarily depicted to scale.

Exemplary embodiments of the present disclosure are further described with reference to the appended figures. It is to be noted that the various features, steps and combinations of features/steps described below and illustrated in the figures can be arranged and organized differently to result in embodiments which are still within the scope of the present disclosure. To assist those of ordinary skill in the art in making and using the disclosed assemblies, systems and methods, reference is made to the appended figures, wherein:

FIG. 1 is a front perspective view of an exemplary door assembly according to the present disclosure;

FIG. 2B is a front perspective view of another exemplary mounting structure;

FIG. 3 is an exploded view of the door assembly of FIG. 1;

FIG. 8 is a side perspective view of another exemplary latching member of the door assembly of FIG. 1;

FIG. 9 is a side perspective view of exemplary push-rod members of the door assembly of FIG. 1;

FIG. 10 is a side perspective view of an exemplary end cap member, spring member, push-rod members and latching members of the door assembly of FIG. 1, prior to assembly;

FIG. 11 is a top cross-sectional view of an exemplary end cap member, spring member, push-rod members, latching members and handle members of the door assembly of FIG. 1, after assembly;

FIGS. 12A-D are top cross-sectional views of the members of FIG. 11, with the end cap member at various mounting positions relative to a mounting structure;

FIGS. 13A-C are back perspective views of the members of FIG. 11, with the end cap member at various mounting positions relative to a mounting structure;

FIGS. 14A-B are top views of the door assembly of FIG. 1, with the door assembly at various mounting positions relative to a mounting structure;

FIG. 15 is a front perspective view of two racks with a mounting structure, and the door assembly of FIG. 1 mounted with respect to the mounting structure; and FIG. 16 is a top view of the overall assembly of FIG. 14.

DETAILED DESCRIPTION

Figure 2A:
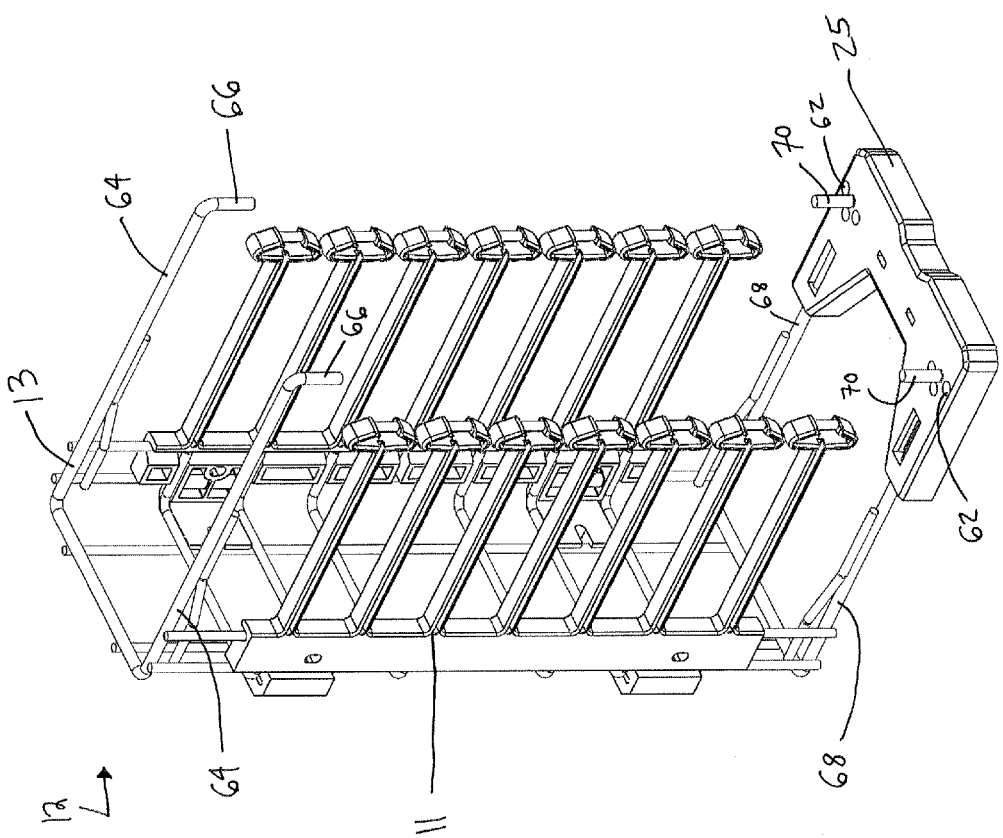
FIG. 2A is a front perspective view of an exemplary mounting structure with which the disclosed door assemblies may be mounted relative thereto.

The exemplary embodiments disclosed herein are illustrative of advantageous door assemblies, and systems of the present disclosure and methods/techniques thereof. It should be understood, however, that the disclosed embodiments are merely exemplary of the present disclosure, which may be embodied in various forms. Therefore, details disclosed herein with reference to exemplary door assemblies/fabrication methods and associated processes/techniques of assembly and use are not to be interpreted as limiting, but merely as the basis for teaching one skilled in the art how to make and use the advantageous door assemblies/systems and/or alternative assemblies of the present disclosure.

In general, the present disclosure provides improved door assemblies, and related methods of use. More particularly, the present disclosure provides advantageous systems/methods for the design and use of door assemblies configured to mount with respect to a mounting structure associated with a rack or the like.

In exemplary embodiments, the present disclosure provides for mechanisms for mounting, opening, closing and releasing a door assembly relative to a mounting structure (e.g., a mounting structure associated with a rack). The present disclosure provides for a rack-mounted door assembly having alternative pivoting axes.

In exemplary embodiments, the door assemblies of the present disclosure are configured and dimensioned so as to be simultaneously hinged at the left and at the right, and to permit easy opening from either the right or left, as well as to allow for the complete removal of the door from its mounting structure. Stated another way, the present disclosure provides a door assembly that enables a user to easily and efficiently open the door assembly from left to right and from right to left, or to completely remove the door assembly from its mounting structure.

In general, the structural mechanisms of the door assemblies of the present disclosure advantageously enable a user to open the door assembly in either direction through interaction with a rotatable handle mechanism that can extend over a substantial portion of the length of the disclosed door member. The disclosed structural mechanisms provide the added benefit of making the door easily removable by opening or releasing mechanisms positioned on both sides of the door. The ease of door removability is particularly advantageous for data transfer media cabinetry or other cabling/wiring applications (e.g., during the installation of a media/computer network, when access to the cabinet interior and/or cable raceways is pronounced, and also when a large number of adds, moves and changes and/or equipment swaps are to be performed).

Referring now to the drawings, like parts are marked throughout the specification and drawings with the same reference numerals, respectively. Drawing figures are not necessarily to scale and in certain views, parts may have been exaggerated for purposes of clarity.

With reference to FIGS. 1 and 3, there is illustrated an embodiment of an exemplary door assembly 10 according to the present disclosure. In exemplary embodiments, door assembly 10 is configured and dimensioned to mount with respect to a mounting structure 12 (FIGS. 2A-2B) associated with one or more racks 82 or the like (e.g., to a cable/wire manager assembly 12, such as a vertical cable manager assembly 12 positioned between two adjacent/proximal racks 82—FIGS. 15-16). It is noted that door assembly 10 and its various components/members can take a variety of forms, shapes and/or designs, and can be fabricated from a variety of suitable materials.

It is noted that exemplary door assemblies 10 are adapted for use in conjunction with one or more racks 82 (e.g., network or server racks) or the like, although the present disclosure is not limited thereto. Rather, the disclosed door assemblies 10 are adapted for use in conjunction with other structures, such as, for example, frames, cabinets, patch panels, enclosures, supporting structures, or other structures that stand to benefit from proximate cable management functionality. For ease of disclosure, the potential structures to which the disclosed door assemblies 10 may be utilized in conjunction with are collective referred to as "rack(s)." However, it is to be understood that the present disclosure is not limited by or to implementations wherein the disclosed door assemblies 10 are used in conjunction with a rack, but may be used in conjunction with any structure/unit that is in proximity to or otherwise associated with cable routing.

In general, exemplary door assembly 10 is configured to mount, open, close and completely release relative to mounting structure 12. As such and as discussed further below, exemplary door assembly 10 includes alternative pivoting axes (e.g., door assembly 10 enables a user to open door assembly 10 from left to right (FIG. 14A) and from right to left (FIG. 14B), or to completely remove the door assembly 10 from mounting structure 12). Thus, door assembly 10 can be configured and dimensioned so as to be simultaneously hinged at the left and at the right, and to permit easy opening from either the right or left (FIGS. 14A-14B), as well as to allow for the complete removal of the door assembly 10 from its mounting structure 12.

The structural mechanisms of exemplary door assembly 10 advantageously enable a user to open the door assembly 10 in either direction through interaction with one or more rotatable handle members 15 that can extend along a substantial portion of the length of the rear portion of cover member 17 of door assembly 10. As discussed further below, such structural mechanisms provide the added benefit of making the door assembly 10 easily removable by opening or releasing mechanisms/structures positioned on both sides of the door assembly 10. As noted above, the ease of door assembly 10 removability is particularly advantageous for data transfer media cabinetry or other cabling/wiring applications.

As shown in FIGS. 1 and 3, exemplary door assembly 10 includes a top end cap member 14, a bottom end cap member 16, and a door cover/component member 17. Of note, exemplary door assembly 10 is substantially symmetric in design, such that many of the components (e.g., end cap members 14, 16; door cover member 17; handle members 15; push-rod members 19) of door assembly 10 may be inverted without loss of functionality, as described herein. For example, the reference to a top end cap member 14 and a bottom end cap member 16 is merely for descriptive purposes, based on the views presented in the accompanying figures, and does not signify significant structural and/or functional distinctions between members 14, 16. Exemplary end cap members 14, 16 may be fabricated/molded from polymeric materials or the like, although the present disclosure is not limited thereto. In some embodiments, it is noted that door assembly 10 may not include end cap members 14 and/or 16.

Figure 4:
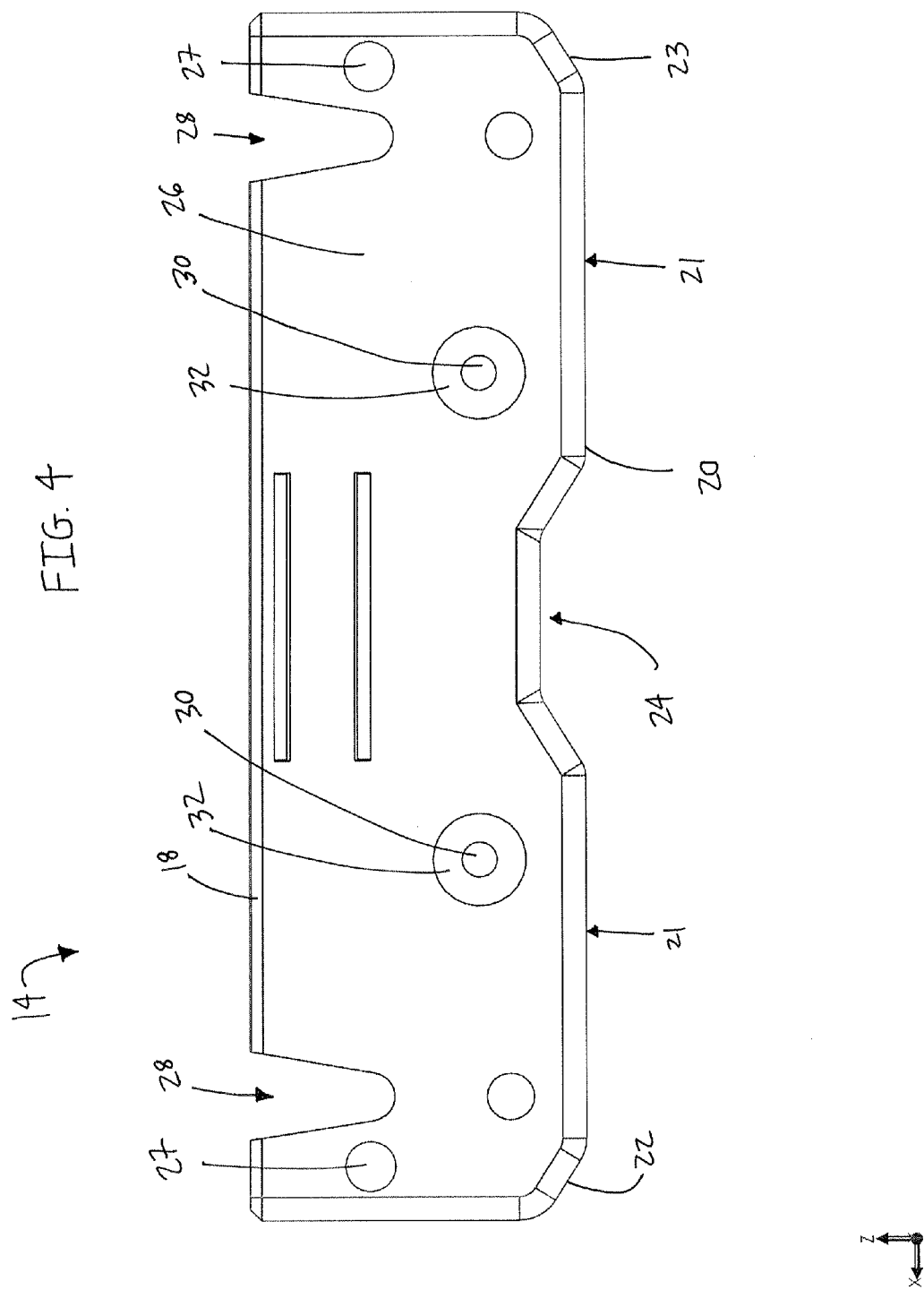
FIG. 4 is a top view of an exemplary end cap member of the door assembly of FIG. 1.

As shown in FIGS. 1 and 4, exemplary top and bottom end cap members 14, 16 include a rear wall 18, and a front wall 20 that includes front wall portions 21 that are substantially parallel to rear wall 18. Top and bottom end cap members 14, 16 can also include arcuate sections 22, 23 at ends of front wall 20, and a user-friendly grooved section 24 of front wall 20 (e.g., to facilitate handling of door assembly 10 during mounting, opening, closing and/or removal of door assembly 10 relative to mounting structure 12).

Top and bottom end cap members 14, 16 also include an outer surface 26, with one or more protuberances 27 (e.g., circular protuberances 27) extending from outer surface 26. One or more slots 28 (e.g., a pair of slots 28) are defined in rear wall 18. In certain embodiments, slots 28 are substantially V-shaped, and generally diverge at an angle of from about 15° to about 25°.

As depicted in FIG. 4, one or more apertures 30 are formed in outer surface 26 for use in mounting end cap members 14, 16 with respect to door cover member 17. Apertures 30 can be advantageously positioned in counter-sink regions 32 so as to seat the fastening members 34 (e.g., screws 34—FIG. 3) below outer surface 26.

Figure 5:
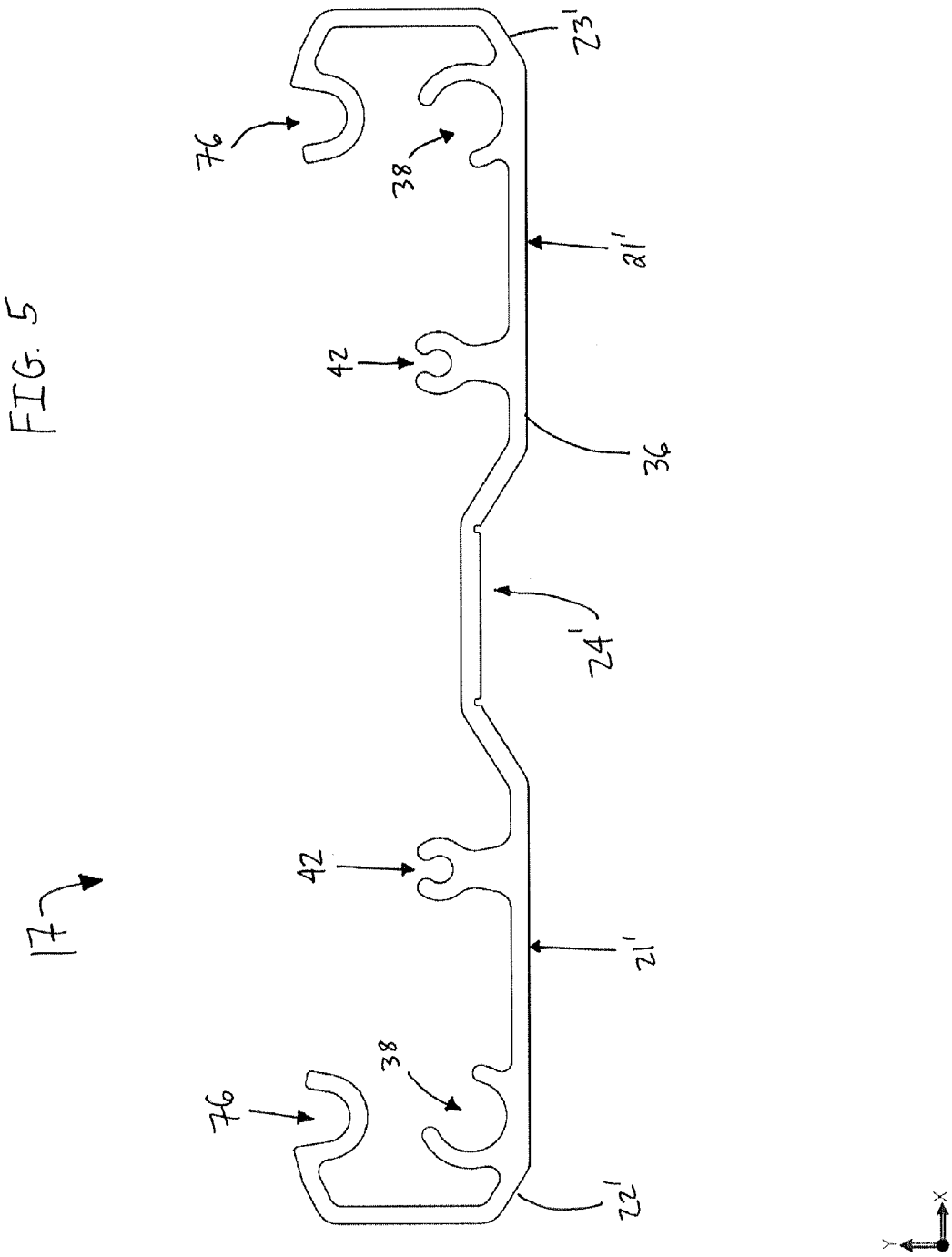
FIG. 5 is a top view of an exemplary door component or cover member of the door assembly of FIG. 1.

As shown in FIGS. 1, 3 and 5, exemplary door cover member 17 includes a front wall 36, with front wall 36 having an overall geometry that generally corresponds to the geometry of front wall 20 of end cap members 14, 16. For example, front wall 36 of cover member 17 can include front wall portions 21', arcuate sections 22', 23', and/or grooved section 24', similar to those corresponding sections/portions of front wall 20. As similarly noted above, grooved section 24' of door cover member 17 can facilitate the handling of door assembly 10 during mounting, opening, closing and/or removal of door assembly 10 (e.g., relative to mounting structure 12). In certain embodiments, the dimensions of end cap members 14, 16 are generally slightly greater than cover member 17, so that end cap members 14, 16 may be mounted with respect to (e.g., fit onto/over) door cover member 17 (e.g., top and bottom portions of door cover member 17 can be positioned within end cap members 14, 16—FIG. 11).

As depicted in FIG. 5, cover member 17 is substantially symmetric in design, and defines first and second handle member retaining grooves or channels 38. In exemplary embodiments, handle member retaining grooves 38 substantially extend along the entire length/height of cover member 17, although the present disclosure is not limited thereto. Rather, it is noted that grooves 38 can extend any distance along cover member 17.

In general and as discussed further below, each handle member retaining groove/channel 38 is configured and dimensioned for receipt of and interaction with at least a portion of a handle member 15 (e.g., with an engagement region 40 of handle member 15—see FIGS. 3, 6 and 11). Exemplary grooves 38 are substantially (partially) circular in cross-section, and the wall defining each groove 38 typically defines an arc (e.g., an arc of about 240° to about 270°).

As shown in FIG. 5, door component 17 includes one or more inner arcuate regions 42. Each arcuate region 42 typically defines a bounded region (e.g., a region bounded by an arc of about 300°). Arcuate regions 42 can extend for the length/height of cover member 17 (or can extend other lengths), and are configured to be aligned with apertures 30 of end cap members 14, 16 (FIGS. 3 and 11). Thus, after cover member 17 is positioned within end cap members 14, 16, then fastening members 34 may be mounted through apertures 30 and into opposite ends of arcuate regions 42 to releasably mount cover member 17 to end cap members 14, 16.

In exemplary embodiments and as shown in FIGS. 3, 7-8 and 11-13, after door assembly 10 is assembled, each handle member 15 is configured and dimensioned to interact with first and second latch members 44, 46 (e.g., for mounting, opening, closing and removal purposes of door assembly 10 relative to mounting structure 12).

As noted above, handle members 15 can be substantially identical structures, and are configured to be mounted with respect to handle member retaining grooves 38 of cover member 17 in opposite orientations (FIGS. 3 and 11). For example, to assemble door assembly 10, a user can first slide/position the engagement region 40 of each handle member 15 into a groove 38 of cover member 17 (FIGS. 3 and 11) until the length of engagement region 40 extends throughout groove 38.

In this position, the top and bottom ends of each groove 38 include enough open groove space (e.g., groove space not occupied by engagement region 40 of handle member 15) to accommodate at least a portion of a securement region 48 of first latch member 44 and a securement region 50 of second latch member 46.

For example and as shown in FIGS. 3, 7-8 and 11, after the left-side handle member 15 (relative to FIG. 3) is inserted into left-side groove 38 of cover member 17, then the securement region 48 of first latch member 44 can be inserted into the open groove space of groove 38 at the top end of cover member 17, and the securement region 50 of second latch member 46 can be inserted into the open groove space of groove 38 at the bottom end of cover member 17.

Likewise, after the right-side handle member 15 (relative to FIG. 3) is inserted into right-side groove 38 of cover member 17, then the securement region 50 of second latch member 46 can be inserted into the open groove space of groove 38 at the top end of cover member 17, and the securement region 48 of first latch member 44 can be inserted into the open groove space of groove 38 at the bottom end of cover member 17.

Next, a user would position the top and bottom portions of door cover member 17 within end cap members 14, 16 (FIGS. 1, 3 and 11), and then fastening members 34 may be mounted through apertures 30 and into opposite ends of arcuate regions 42 to releasably mount cover member 17 to end cap members 14, 16. As discussed further below, each end cap member 14, 16 typically includes two push-rod members 19 and a spring member 52 mounted with respect to each end cap member 14, 16, prior to mounting cover member 17 (which includes handle members 15 and latch members 44, 46 mounted therein) to end cap members 14, 16. In some embodiments, it is noted that end cap members 14 and/or 16 may not include push-rod members 19 and/or spring member 52.

Figure 7:
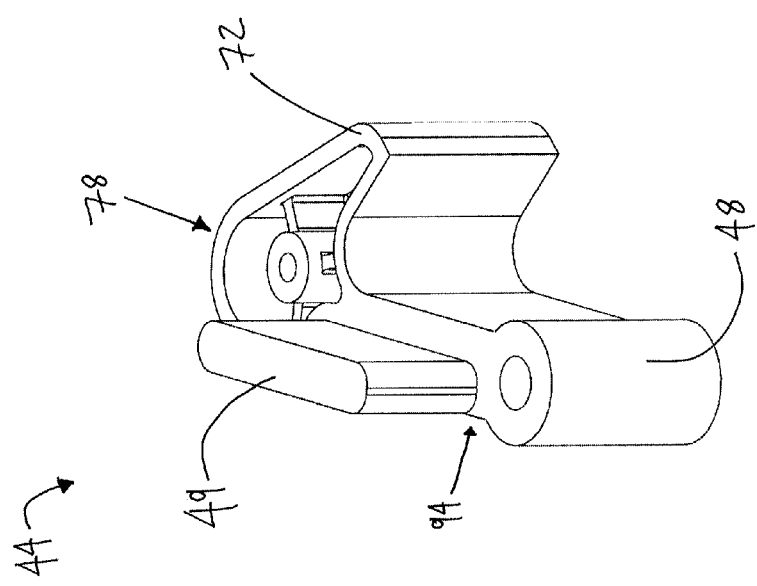
FIG. 7 is a side perspective view of an exemplary latching member of the door assembly of FIG. 1.

As shown in FIGS. 7-8, latch members 44, 46 include a body portion that is substantially J-shaped or fish-hook shaped. Latch members 44 include a top surface that includes an engagement wall 49 extending therefrom, and latch members 46 include a top surface that includes an engagement wall 51 extending therefrom.

Figure 6:
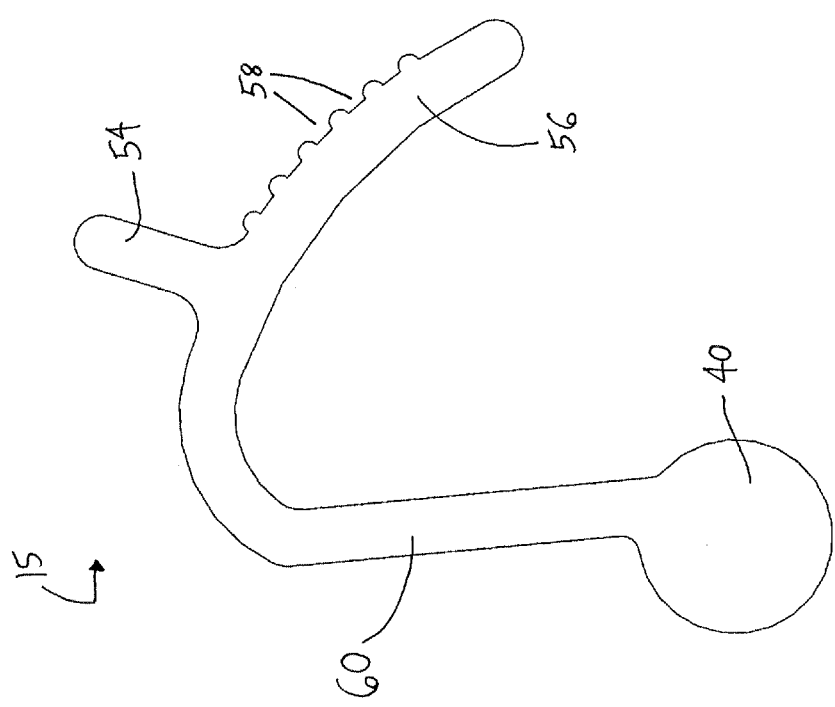
FIG. 6 is a top view of an exemplary handle member of the door assembly of FIG. 1.

As shown in FIGS. 3, 6 and 11, each handle member 15 includes an outwardly extending, user-friendly handle portion 54 that extends away from arcuate handle wall 56. Arcuate handle wall 56 can include user-friendly finger grooves/ridges 58 or the like.

Arcuate handle wall 56 joins with mating wall 60 of handle member 15. As discussed further below and after assembly of door assembly 10, at least a portion of mating wall 60 is configured to engage or mate with at least portion of engagement wall 49 of the first latch member 44, and with at least a portion of engagement wall 51 of the second latch member 46 (FIG. 11).

The operation of exemplary door assembly 10 for purposes of mounting, opening, closing, and removal is now described.

With reference to FIGS. 1 and 2A-2B, exemplary door assembly 10 has particular utility for use in conjunction with mounting structure 12. Exemplary mounting structure 12 takes the form of a cable/wire manager assembly 12 (e.g., vertical cable manager assembly 12), although the present disclosure is not limited thereto. Rather, it is noted that mounting structure 12 can take a variety of forms. As shown in FIGS. 2A and 2B, exemplary mounting structure 12 includes a wire cage assembly 13 and a plurality of cable guides 11.

Mounting structure 12 can further include a lower base member 25 that is mounted with respect to wire cage assembly 13. Mounting structure 12 can also include an upper base member 29 mounted with respect to wire cage assembly 13 (FIG. 2B). In certain embodiments, it is noted that the reference to an upper base member 29 and a lower base member 25 is merely for descriptive purposes, based on the views presented in the accompanying figures, and does not signify significant structural and/or functional distinctions between members 25, 29.

Exemplary base member 25 (and/or 29) includes one or more indents 62 (e.g., circular indents 62) that are positioned on the surface of base member 25 so as to align with protuberances 27 of end caps 14, 16. Additional details concerning the design, operation and advantageous functionalities of exemplary mounting structure 12 is provided in U.S. Pat. No. 6,946,605, the entire subject matter of which is hereby incorporated by reference in its entirety.

As shown in FIGS. 2A-B, wire cage assembly 13 includes top wire segments 64 that include downward projections/pins 66. Wire cage assembly 13 further includes bottom wire segments 68 that include upward projections/pins 70 that extend through apertures formed in base member 25. As shown in FIG. 2B, downward projections/pins 66 can extend through apertures formed in base member 29. Opposed downward projections 66 and upward projections 70 can be substantially aligned and can be advantageously spaced by a distance that permits them to cooperate with the latching mechanisms/structures of door assembly 10, as discussed further below.

It is noted that exemplary door assembly 10 can be mounted and employed with respect to mounting structure 12 and, more particularly, door assembly 10 can be mounted and employed with respect to wire cage assembly 13.

However, it is also noted that exemplary door assembly 10 is not limited to use with a mounting structure 12 and/or wire cage assembly 13 of the type disclosed in FIGS. 2A-B. Rather, exemplary door assembly 10 can be advantageously mounted and employed in connection with other mounting systems that includes mounting structures that are structurally and/or functionally similar to projections 66, 70 (e.g., projections/pins that can interact with the disclosed latching mechanisms/structures of the present disclosure).

Exemplary door assembly 10 is mounted with respect to mounting structure 12 by aligning projections/pins 66, 70 with V-shaped slots 28 formed in end cap members 14, 16.

Moreover and as discussed further below, each handle member 15 is configured to be rotated by a user (e.g., via handle portion 54) so that mating wall 60 of handle member 15 pushes against engagement walls 49, 51 of latch members 44, 46 to thereby move latching portions 72, 74 of latch members 44, 46 so that pins 66, 70 can pass by the moved latching portions 72, 74 and travel through grooves 28 until they rest against pin retaining grooves 76 of cover member 17.

After pins 66, 70 have passed by latching portions 72, 74 and are resting or housed proximal to grooves 28, then the user may release handle member 15 so that latching portions 72, 74 travel back over/against pins 66, 70 to thereby releasably and securely capture and secure pins 66, 70 in grooves 76. As discussed further below, after the user releases handle member 15, the latching portions 72, 74 travel over/against pins 66, 70 via force from spring member 52 pressing against push-rod members 19, which thereby press/push against engagement surfaces 78, 80 (e.g., arcuate engagement surfaces 78, 80) of latch members 44, 46.

In certain embodiments, it is noted that when door assembly 10 is being mounted with respect to mounting structure 12 (or when an open side (FIG. 14A) of door assembly 10 is being re-attached to mounting structure 12), when the pins 66, 70 travel in grooves 28, each pin 66, 70 is configured to press against and move latching portions 72, 74 so that pins 66, 70 can pass by the moved latching portions 72, 74 and travel through grooves 28 until they rest against pin retaining grooves 76. After the pins 66, 70 have passed by latching portions 72, 74 and are resting or housed proximal to grooves 28, latching portions 72, 74 travel back over/against pins 66, 70 to thereby releasably and securely capture and secure pins 66, 70 in grooves 76. As noted above, the latching portions 72, 74 can travel over/against pins 66, 70 via force from spring member 52 pressing against push-rod members 19, which thereby press/push against engagement surfaces 78, 80 of latch members 44, 46.

In exemplary embodiments, after door assembly 10 is mounted with respect to mounting structure 12 (e.g., pins 66, 70 are secured/captured in grooves 76), the protuberances 27 of end cap members 14, 16 mate/cooperate with indents 62 of base members 25, 29 (e.g., when door assembly 10 is in the closed position).

As shown in FIGS. 3 and 9-11, each end cap member 14, 16 can include one or more push-rod members 19 and a spring member 52. Exemplary end cap members 14, 16 each include two push-rod members 19 mounted thereto. Each end cap member 14, 16 can include two push-rod retaining walls 84 (e.g., molded and/or flexible retaining walls 84). In general, the retaining walls 84 are configured and dimensioned to house/retain at least a portion of each push-rod member 19. In certain embodiments, the two push-rod members 19 (which themselves house/retain spring member 52) are configured to be snap-fit into or with respect to retaining walls 84 for securement/housing therewithin. Each retaining wall 84 typically includes a securement portion 85 at a top end thereof (FIG. 10).

In exemplary embodiments, each push-rod member 19 is substantially identical to one another is structure/design. The two push-rod members 19 of each end cap member 14, 16 are configured and dimensioned to be positioned so that they each provide for a portion of a spring member channel or housing 86 between the two push-rod members 19 (FIGS. 9-10), the channel/housing 86 configured/dimensioned to house spring member 52 (FIG. 11).

After the cover member 17 (which includes the handle members 15 and latch members 44, 46 within grooves 38) is mounted with respect to end cap members 14, 16 (each of which includes push-rod members 19 and spring member 52 mounted thereto via retaining walls 84 and channel/housing 86), then each end 88 of each push-rod member 19 is proximal to or pressing against an engagement surface 78, 80 of latch members 44, 46 (FIG. 11), and the spring member 52 is in a substantially expanded position (FIG. 11). In this position as shown in FIG. 11, the latching portions 72, 74 of latch members 44, 46 are extended over at least a portion of pin retaining grooves 76.

After the pins 66, 70 have passed by latching portions 72, 74 and are resting or housed proximal to grooves 28 (and after handle members 15 are released by a user, if applicable), latching portions 72, 74 travel back (via force from spring member 52 and push-rod members 19) over/against pins 66, 70 to thereby releasably and securely capture and secure pins 66, 70 in grooves 76.

More particularly, exemplary latching portions 72, 74 are self-latching (e.g., spring-loaded via interaction with spring member 52 and push-rod members 19), meaning that after pins 66, 70 have passed by them (in either direction), and after the user releases handle member 15 (if applicable), the latching portions 72, 74 travel over at least a portion of grooves 76 (FIGS. 11 and 12A) via force from spring member 52 pressing against push-rod members 19, which thereby press/push against engagement surfaces 78, 80 of latch members 44, 46 via ends 88.

For example, when door assembly 10 is ready to be mounted to structure 12, the latching portions 72, 74 are in the positions shown in FIG. 11. As the pins 66, 70 begin to travel in slots 28 towards grooves 76 (FIGS. 13B—left side, and FIG. 12D—right side), the pins 66, 70 press against and move latching portions 72, 74 so that pins 66, 70 can pass by the moved latching portions 72, 74 and travel through grooves 28 until they rest against pin retaining grooves 76. After the pins 66, 70 have passed the latching portions 72, 74, then the latching portions 72, 74 travel back (via force from spring member 52 and push-rod members 19) over/against pins 66, 70 to thereby releasably and securely capture and secure pins 66, 70 in grooves 76 (FIGS. 12A and 13C).

Figure 12B:
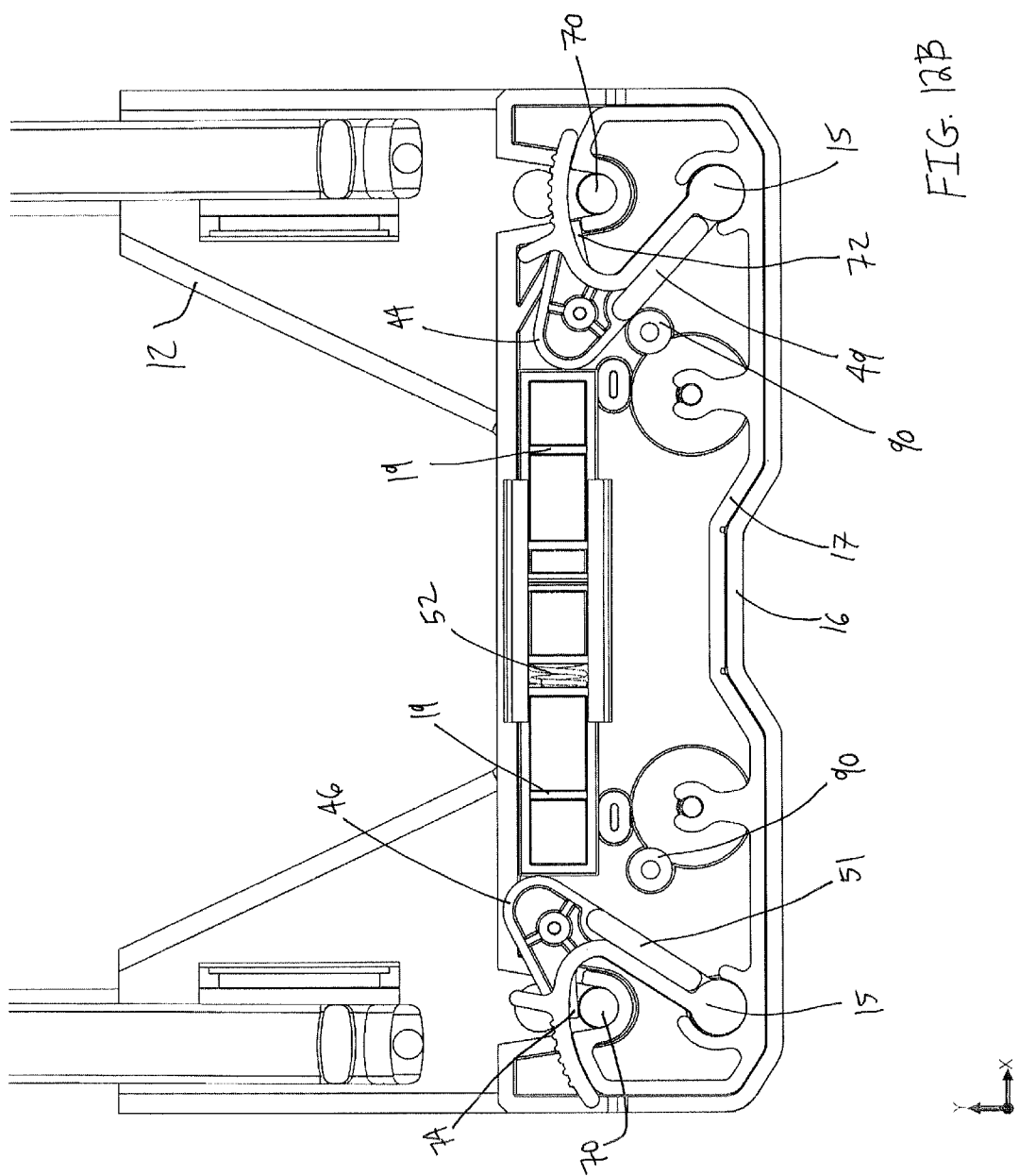
Figure 12D:
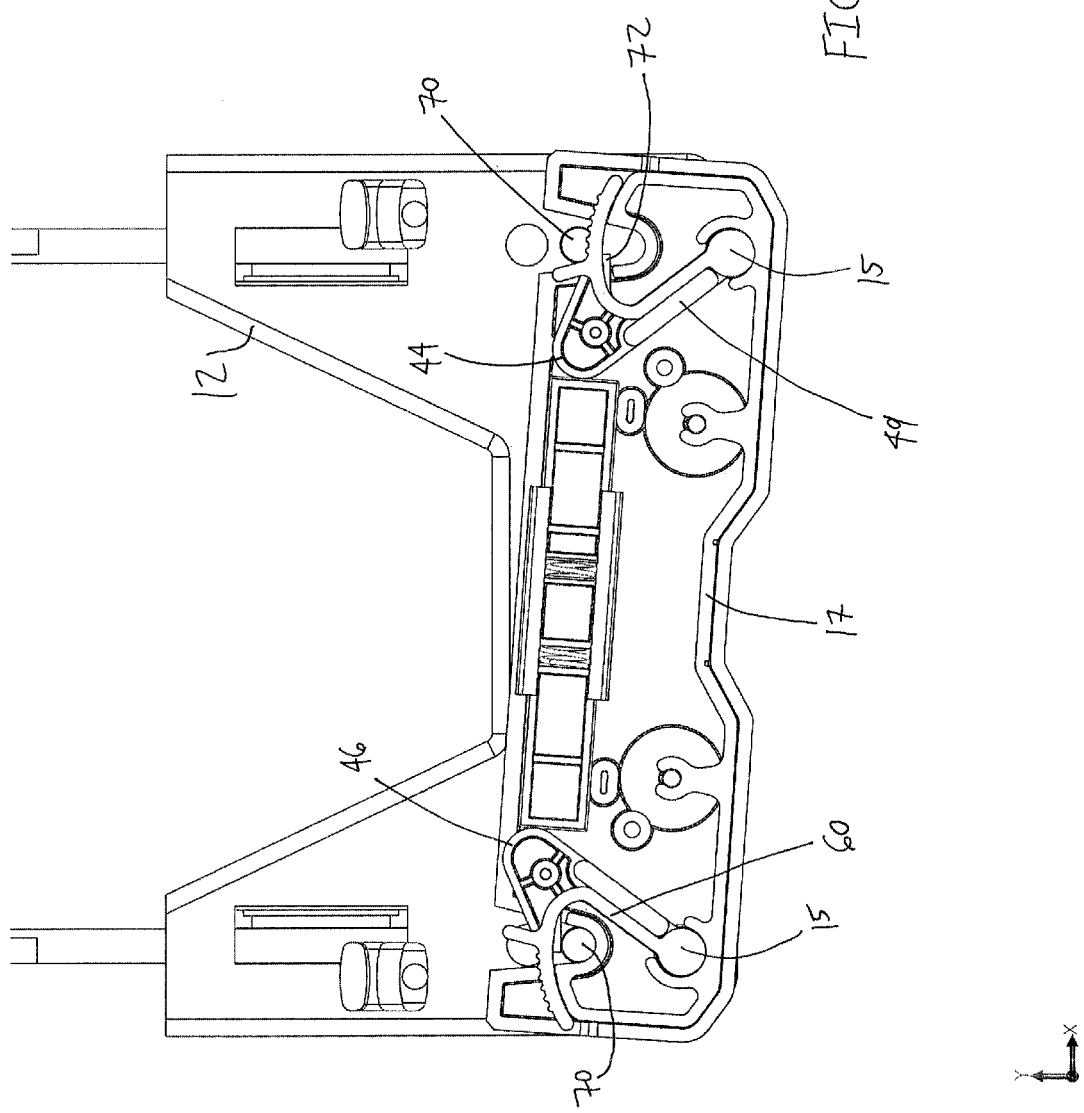
Figure 13C:
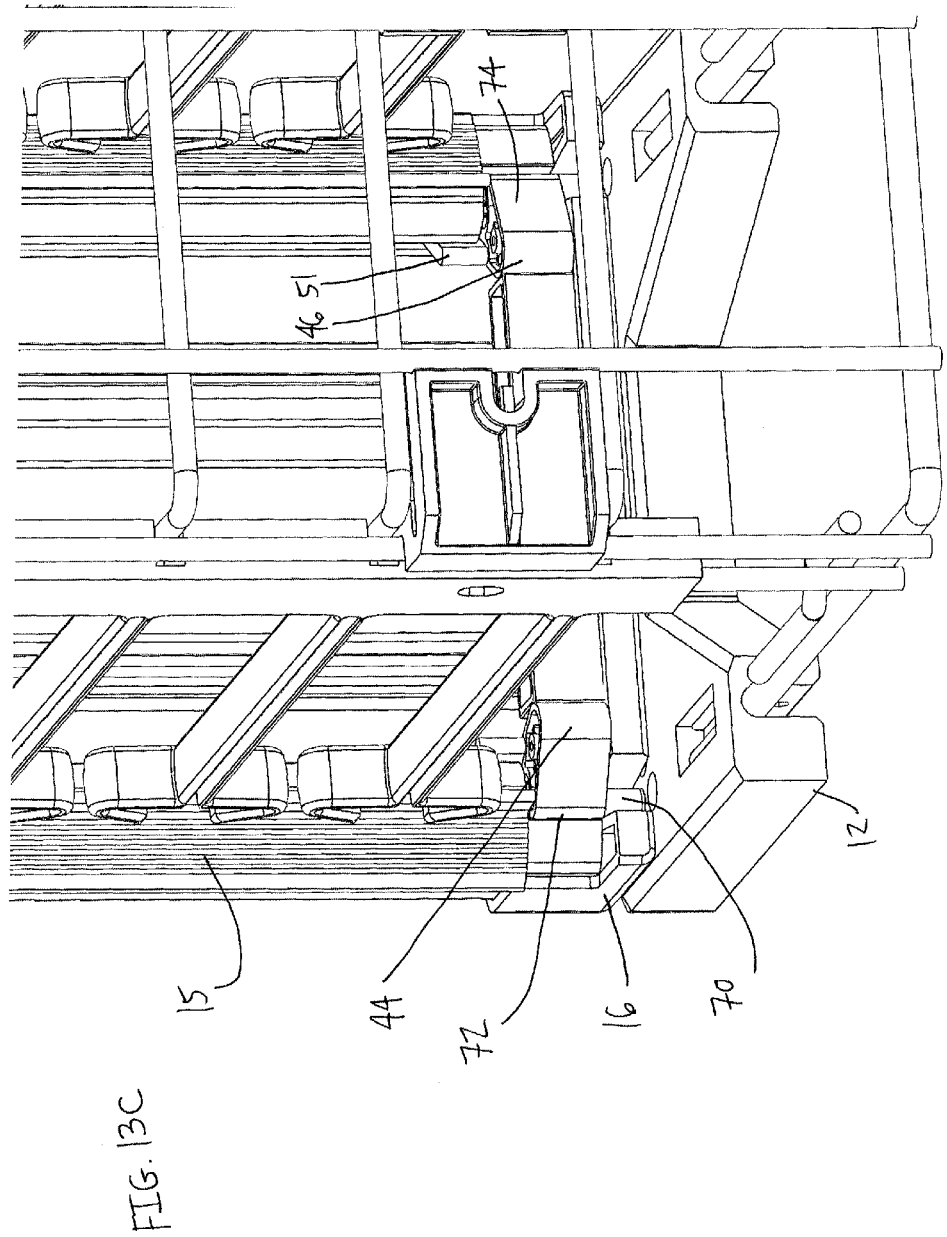

Alternatively, when door assembly 10 is ready to be mounted to structure 12, a user may first rotate each handle member 15 (e.g., via handle portion 54) so that mating wall 60 of handle member 15 pushes against engagement walls 49, 51 of latch members 44, 46 to thereby move latching portions 72, 74 of latch members 44, 46 so that pins 66, 70 can pass by the moved latching portions 72, 74 and travel through grooves 28 until they rest against pin retaining grooves 76 of cover member 17 (FIG. 12B, right side showing handle member 15 rotated and latching portion 72 moved to allow pin 70 to sit in groove 76).

After pins 66, 70 have passed by latching portions 72, 74 and are housed proximal to grooves 28, then the user may release handle member 15 so that latching portions 72, 74 travel back over/against pins 66, 70 to thereby releasably and securely capture and secure pins 66, 70 in grooves 76. As noted, after the user releases handle member 15, the latching portions 72, 74 travel over/against pins 66, 70 via force from spring member 52 pressing against push-rod members 19, which thereby press/push against engagement surfaces 78, 80 of latch members 44, 46.

As noted above, when door assembly 10 is being mounted with respect to mounting structure 12 (or when an open side (FIGS. 14A-14B) of door assembly 10 is being re-attached to mounting structure 12), when the pins 66, 70 travel in grooves 28, each pin 66, 70 is configured to press against and move latching portions 72, 74 (FIG. 12D), which also moves engagement surfaces 78, 80 so that they press against and move ends 88 inward via contraction of spring member 52, and so that pins 66, 70 can then pass by the moved latching portions 72, 74 and travel through grooves 28 until they rest against pin retaining grooves 76.

Alternatively, it is noted that each handle member 15 is configured to be rotated by a user so that mating wall 60 of handle member 15 pushes against engagement walls 49, 51 of latch members 44, 46 to thereby move latching portions 72, 74, which also moves engagement surfaces 78, 80 so that they press against and move ends 88 inward via contraction of spring member 52, and so that pins 66, 70 can then pass by the moved latching portions 72, 74 and travel through grooves 28 until they rest against pin retaining grooves 76. In this regard, it is noted that each end cap member 14, 16 typically includes two boss members 90 (e.g., cylindrical boss members 90) that extend up from the bottom surface of end cap members 14, 16, with each boss member 90 configured to provide a stopping/abutment surface that contacts an abutment wall 94, 95 of each latch member 44, 46 to prevent each latch member 44, 46 from rotating too far inwards towards the center of end cap members 14, 16 (e.g., to stop latch members 44, 46 from rotating out of engagement with ends 88 of push-rod members 19—FIG. 12B).

After the pins 66, 70 have passed by latching portions 72, 74 and are resting or housed proximal to grooves 28, latching portions 72, 74 travel back over/against pins 66, 70 to thereby releasably and securely capture and secure pins 66, 70 in grooves 76. As noted above, the latching portions 72, 74 can travel over/against pins 66, 70 via force from spring member 52 pressing against push-rod members 19, which thereby press/push against engagement surfaces 78, 80 of latch members 44, 46, to thereby releasably and securely capture and secure pins 66, 70 in grooves 76 (FIGS. 12A and 13C).

After door assembly 10 has been releasably mounted to structure 12 (FIG. 12A), either side of door assembly 10 can be opened via handle members 15, as desired. Also, it is noted that both sides of door assembly 10 can be opened via handle members 15, and door assembly 10 can thereafter be removed from mounting structure 12, if desired.

In certain embodiments and as shown in FIG. 12B, when handle member 15 (right side of FIG. 12B) is rotated by a user so that mating wall 60 of handle member 15 pushes against engagement wall 49 of latch member 44 to thereby move latching portion 72 and move engagement surface 78 to press against and move end 88 of push-rod member 19 inward via contraction of spring member 52, it is noted that spring member 52 is then in a substantially contracted state. As such, and if handle member 15 (right side of FIG. 12B) remains rotated by a user in this position, then the push-rod members 19 and spring member 52 prevent the other handle member 15 (left side of FIG. 12B) from being rotated inward, thus preventing mating wall 60 of left-side handle member 15 (left side of FIG. 12B) from pushing against engagement wall 51 of latch member 46 to thereby move latching portion 74 and move engagement surface 80 to press against and move end 88 of left-side push-rod member 19 inward via further contraction of spring member 52. In such embodiments, such functionality and configuration prevents a user from removing both sides (e.g., left and right sides) of door assembly 10 from mounting structure 12 at the same time.

However, in other embodiments, it is noted that the members/surfaces of door assembly 10 can allow a user to remove both sides (e.g., left and right sides) of door assembly 10 from mounting structure 12 at the same time. For example, if handle member 15 (right side of FIG. 12B) remains rotated by a user in this position, then the push-rod members 19 and spring member 52 can allow the other handle member 15 (left side of FIG. 12B) to rotate inward, thus moving mating wall 60 of left-side handle member 15 (left side of FIG. 12B) to push against engagement wall 51 of latch member 46 to thereby move latching portion 74 and move engagement surface 80 to press against and move end 88 of left-side push-rod member 19 inward via further contraction of spring member 52 (and therefore allow a user to remove both sides of door assembly 10 from mounting structure 12 at the same time).

Figure 14A:
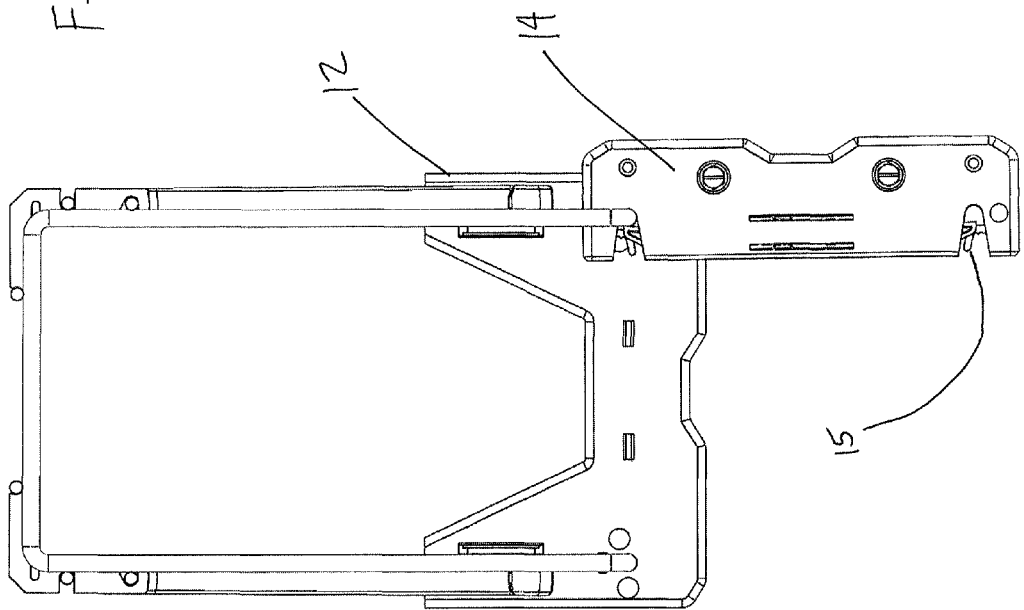

In exemplary embodiments, after door assembly 10 has been releasably mounted to structure 12 (FIG. 12A), a user may wish to rotate the handle member 15 on the right side (FIG. 12B) to move latching portion 72 so that pin 70 is free to move out of groove 76 (FIG. 12C). Thus, after pin 70 moves past latching portion 72, the latching portion 72 is pressed via push-rod member 19 over groove 76 (FIG. 12C), and the door is able to be swung open from right to left (e.g., as shown in FIGS. 12C and 14B). Thereafter, the door assembly 10 may be closed relative to pin 70 and structure 12, as discussed above (e.g., by moving pin 70 past latching portion 72 (FIG. 12) until it is secured in groove 76 (FIG. 12A)). It is noted that the other side of door assembly 10 (e.g., left side of door assembly 10 in FIGS. 12A and 14A) can be opened and closed in a similar fashion as discussed above (see also FIG. 14A). Again, both sides of door assembly 10 may also be released from structure 12 to remove door assembly 10 from structure 12, if desired (and then re-mounted to structure 12, if desired).

As shown in FIG. 14A, by releasing left-side pins 66, 70 from grooves 76, door assembly 10 is free to swing open from left-to-right (e.g., in a counter-clockwise direction). Of note and with reference to FIG. 14A, right-side pins 66, 70 remain captured or locked within grooves 76. By contrast, as shown in FIG. 14B, door assembly 10 is also configured to rotate from right-to-left (e.g., in a clockwise direction), by releasing right-side pins 66, 70 from grooves 76. Moreover, door assembly 10 facilitates complete removal from an associated mounting structure 12 (e.g., cable management system 12), by releasing all pins 66, 70 from their associated grooves 76 and latching portions 72, 74.

As shown in FIGS. 15-16, an exemplary door assembly 10 and associated mounting structure 12 may be mounted with respect to conventional rack, frame and/or cabinet assemblies. Thus, as shown in FIGS. 15-16, wire cage assembly 13 is mounted to first and second racks 82. A plurality of cable guides 11 are mounted to wire cage assembly 13. An exemplary door assembly 10 is also mounted with respect to wire cage assembly 13 as discussed above. Once mounted to racks 82, the wire cage assembly 13 provides an advantageous cable management system for routing of cables/wires relative to equipment positioned on/in racks 82, and door assembly 10 provides ready access to such cables/wires (e.g., by permitting left-to-right or right-to-left opening of door assembly 10, and complete removal of door assembly 10 therefrom).

The present disclosure thus provides advantageous and easily-utilized mechanisms/methods for mounting, opening, closing and releasing a door assembly 10 relative to a mounting structure 12. Additional advantageous features and functionalities associated with the disclosed door assemblies 10, as well as their methods for use, are readily apparent from the detailed description provided herein.

Although the systems and methods of the present disclosure have been described with reference to exemplary embodiments thereof, the present disclosure is not limited to such exemplary embodiments and/or implementations. Rather, the systems and methods of the present disclosure are susceptible to many implementations and applications, as will be readily apparent to persons skilled in the art from the disclosure hereof. The present disclosure expressly encompasses such modifications, enhancements and/or variations of the disclosed embodiments. Since many changes could be made in the above construction and many widely different embodiments of this disclosure could be made without departing from the scope thereof, it is intended that all matter contained in the drawings and specification shall be interpreted as illustrative and not in a limiting sense. Additional modifications, changes, and substitutions are intended in the foregoing disclosure. Accordingly, it is appropriate that the appended claims be construed broadly and in a manner consistent with the scope of the disclosure.

What is claimed is:

1. A door assembly comprising:
  a cover member, the cover member having: (i) first and second handle member retaining grooves, and (ii) first and second pin retaining grooves;
  a pair of handle members that are rotatably mounted with respect to the first and second handle member retaining grooves, respectively, each handle member retaining groove having at least a portion of a first latch member mounted with respect to a first end of the handle member retaining groove and at least a portion of a second latch member mounted with respect to a second end of the handle member retaining groove;
  a pair of end cap members that are mountable with respect to a first end and a second end of the cover member, respectively;
  wherein the first and second latch members mounted with respect to the first handle member retaining groove are movable between: (i) a first position where a mounting structure is configured to be received by the first pin retaining groove, and (ii) a second position where the mounting structure is configured to be releasably secured in the first pin retaining groove via a latching portion of the first and second latch members; and
  wherein the first and second latch members mounted with respect to the second handle member retaining groove are movable between: (i) a first position where the mounting structure is configured to be received by the second pin retaining groove, and (ii) a second position where the mounting structure is configured to be releasably secured in the second pin retaining groove via a latching portion of the first and second latch members;
  wherein each end cap member includes a rear wall having first and second slots formed therein;

wherein at least a portion of the first pin retaining groove is configured to be positioned within the first slots of the end cap members when the end cap members are mounted with respect to the ends of the cover member; and wherein at least a portion of the second pin retaining groove is configured to be positioned within the second slots of the end cap members when the end cap members are mounted with respect to the ends of the cover member.

2. The door assembly of claim 1, wherein the handle member of the first handle member retaining groove is configured to be moved by a user to move the first and second latch members of the first handle member retaining groove to the first position; and wherein the handle member of the second handle member retaining groove is configured to be moved by the user to move the first and second latch members of the second handle member retaining groove to the first position.

3. The door assembly of claim 1, wherein the handle member of the first handle member retaining groove includes a first mating wall, the first mating wall configured to be moved by a user to engage and move engagement walls of the first and second latch members of the first handle member retaining groove to thereby move the first and second latch members of the first handle member retaining groove to the first position; and wherein the handle member of the second handle member retaining groove includes a second mating wall, the second mating wall configured to be moved by a user to engage and move engagement walls of the first and second latch members of the second handle member retaining groove to thereby move the first and second latch members of the second handle member retaining groove to the first position.

4. The door assembly of claim 1 wherein each end cap member includes first and second boss members, the first boss members of the end cap members configured to abut against and stop movement of a respective first or second latch member of the first handle member retaining groove at an end point of the first position for the first and second latch members of the first handle member retaining groove; and wherein the second boss members of the end cap members are configured to abut against and stop movement of a respective first or second latch member of the second handle member retaining groove at an end point of the first position for the first and second latch members of the second handle member retaining groove.

5. The door assembly of claim 1, wherein the first and second handle member retaining grooves are each configured and dimensioned for receipt of and interaction with an engagement region of a respective handle member.

6. A door assembly comprising:

a cover member, the cover member having: (i) first and second handle member retaining grooves, and (ii) first and second pin retaining grooves;

a pair of handle members that are rotatably mounted with respect to the first and second handle member retaining grooves, respectively, each handle member retaining groove having at least a portion of a first latch member mounted with respect to a first end of the handle member retaining groove and at least a portion of a second latch member mounted with respect to a second end of the handle member retaining groove;

a pair of end cap members that are mountable with respect to a first end and a second end of the cover member, respectively;

wherein the first and second latch members mounted with respect to the first handle member retaining groove are movable between: (i) a first position where a mounting structure is configured to be received by the first pin retaining groove, and (ii) a second position where the mounting structure is configured to be releasably secured in the first pin retaining groove via a latching portion of the first and second latch members; and wherein the first and second latch members mounted with respect to the second handle member retaining groove are movable between: (i) a first position where the mounting structure is configured to be received by the second pin retaining groove, and (ii) a second position where the mounting structure is configured to be releasably secured in the second pin retaining groove via a latching portion of the first and second latch members;

wherein each end cap member includes first and second push-rod members mounted with respect to each end cap member, the first and second push-rod members defining a channel that houses a spring member;

wherein after the first and second latch members of the first handle member retaining groove have been moved to the first position and the mounting structure is received by the first pin retaining groove, the first push-rod members of the end cap members, via force from the spring members, are configured to move the first and second latch members of the first handle member retaining groove to the second position;

wherein after the first and second latch members of the second handle member retaining groove have been moved to the first position and the mounting structure is received by the second pin retaining groove, the second push-rod members of the end cap members, via force from the spring members, are configured to move the first and second latch members of the second handle member retaining groove to the second position; and wherein each end cap member includes two retaining walls, the two retaining walls configured to house and retain the first and second push-rod members.

7. The door assembly of claim 6, wherein the handle member of the first handle member retaining groove includes a first mating wall, the first mating wall configured to be moved by a user to engage and move engagement walls of the first and second latch members of the first handle member retaining groove to thereby move the first and second latch members of the first handle member retaining groove to the first position; and wherein the handle member of the second handle member retaining groove includes a second mating wall, the second mating wall configured to be moved by a user to engage and move engagement walls of the first and second latch members of the second handle member retaining groove to thereby move the first and second latch members of the second handle member retaining groove to the first position.

8. The door assembly of claim 6, wherein the handle member of the first handle member retaining groove is configured to be moved by a user to move the first and second latch members of the first handle member retaining groove to the first position; and wherein the handle member of the second handle member retaining groove is configured to be moved by the user to move the first and second latch members of the second handle member retaining groove to the first position.

9. The door assembly of claim 8, wherein after the first and second latch members of the first handle member retaining groove have been moved to the first position and after the user releases the handle member of the first handle member retaining groove, then the first push-rod members of the end cap members, via force from the spring members, are configured to move the first and second latch members of the first handle member retaining groove to the second position; and wherein after the first and second latch members of the second handle member retaining groove have been moved to the first position and after the user releases the handle member of the second handle member retaining groove, then the second push-rod members of the end cap members, via force from the spring members, are configured to move the first and second latch members of the second handle member retaining groove to the second position.

10. The door assembly of claim 8, wherein when the handle member of the first handle member retaining groove is moved by the user to move the first and second latch members of the first handle member retaining groove to the first position, the first push-rod members of the end cap members are moved inward by the first and second latch members of the first handle member retaining groove and the spring member contracts; and wherein when the handle member of the second handle member retaining groove is moved by the user to move the first and second latch members of the second handle member retaining groove to the first position, the second push-rod members of the end cap members are moved inward by the first and second latch members of the second handle member retaining groove and the spring member contracts.

11. The door assembly of claim 8, wherein when the first and second latch members of the first handle member retaining groove are moved to the first position by the user via the handle member of the first handle member retaining groove, the first and second push-rod members and the spring member prevent the user from simultaneously moving the first and second latch members of the second handle member retaining groove to the first position via the handle member of the second handle member retaining groove; and wherein when the first and second latch members of the second handle member retaining groove are moved to the first position by the user via the handle member of the second handle member retaining groove, the first and second push-rod members and the spring member prevent the user from simultaneously moving the first and second latch members of the first handle member retaining groove to the first position via the handle member of the first handle member retaining groove.

12. The door assembly of claim 6, wherein each end cap member includes first and second boss members, the first boss members of the end cap members configured to abut against and stop movement of a respective first or second latch member of the first handle member retaining groove at an end point of the first position for the first and second latch members of the first handle member retaining groove; and wherein the second boss members of the end cap members are configured to abut against and stop movement of a respective first or second latch member of the second handle member retaining groove at an end point of the first position for the first and second latch members of the second handle member retaining groove.

13. The door assembly of claim 6, wherein the first and second handle member retaining grooves are each configured and dimensioned for receipt of and interaction with an engagement region of a respective handle member.

14. The door assembly of claim 6, wherein each first and second push-rod member of each end cap member includes an end portion that is proximal to an engagement surface of a respective first or second latch member.

15. A door assembly comprising:

a cover member, the cover member having: (i) first and second handle member retaining grooves, and (ii) first and second pin retaining grooves;

a pair of end cap members that are mountable with respect to a first end and a second end of the cover member, respectively;

a pair of handle members that are rotatably mounted with respect to the first and second handle member retaining grooves, respectively, each handle member retaining groove having at least a portion of a first latch member mounted with respect to a first end of the handle member retaining groove and at least a portion of a second latch member mounted with respect to a second end of the handle member retaining groove;

wherein the first and second latch members mounted with respect to the first handle member retaining groove are movable between: (i) a first position where a mounting structure is configured to be received by the first pin retaining groove, and (ii) a second position where the mounting structure is configured to be releasably secured in the first pin retaining groove via a latching portion of the first and second latch members; and wherein the first and second latch members mounted with respect to the second handle member retaining groove are movable between: (i) a first position where the mounting structure is configured to be received by the second pin retaining groove, and (ii) a second position where the mounting structure is configured to be releasably secured in the second pin retaining groove via a latching portion of the first and second latch members;

wherein each end cap member includes first and second push-rod members mounted with respect to each end cap member, the first and second push-rod members defining a channel that houses a spring member;

wherein after the first and second latch members of the first handle member retaining groove have been moved to the first position and the mounting structure is received by the first pin retaining groove, the first push-rod members of the end cap members, via force from the spring members, are configured to move the first and second latch members of the first handle member retaining groove to the second position;

wherein after the first and second latch members of the second handle member retaining groove have been moved to the first position and the mounting structure is received by the second pin retaining groove, the second push-rod members of the end cap members, via force from the spring members, are configured to move the first and second latch members of the second handle member retaining groove to the second position;

wherein the first and second handle member retaining grooves are each configured and dimensioned for receipt of and interaction with an engagement region of a respective handle member;

wherein the handle member of the first handle member retaining groove includes a first mating wall, the first mating wall configured to be moved by a user to engage and move engagement walls of the first and second latch members of the first handle member retaining groove to thereby move the first and second latch members of the first handle member retaining groove to the first position; and wherein the handle member of the second handle member retaining groove includes a second mating wall, the second mating wall configured to be moved by a user to engage and move engagement walls of the first and second latch members of the second handle member retaining groove to thereby move the first and second latch members of the second handle member retaining groove to the first position.

16. The door assembly of claim 15, wherein when the first and second latch members of the first handle member retaining groove are moved to the first position by the user via the handle member of the first handle member retaining groove, the first and second push-rod members and the spring member prevent the user from simultaneously moving the first and second latch members of the second handle member retaining groove to the first position via the handle member of the second handle member retaining groove; and wherein when the first and second latch members of the second handle member retaining groove are moved to the first position by the user via the handle member of the second handle member retaining groove, the first and second push-rod members and the spring member prevent the user from simultaneously moving the first and second latch members of the first handle member retaining groove to the first position via the handle member of the first handle member retaining groove.

* * * * *